US010074435B2

(12) United States Patent
Park et al.

(10) Patent No.: US 10,074,435 B2
(45) Date of Patent: Sep. 11, 2018

(54) METHOD OF INITIALIZING AND PROGRAMING 3D NON-VOLATILE MEMORY DEVICE

(71) Applicants: SK hynix Inc., Icheon (KR); Seoul National University R&DB Foundation, Seoul (KR)

(72) Inventors: Byung Gook Park, Seoul (KR); Dae Woong Kwon, Seoul (KR); Do Bin Kim, Seoul (KR); Sang Ho Lee, Seoul (KR)

(73) Assignees: SK HYNIX INC., Icheon (KR); SEOUL NATIONAL UNIVERSITY R&DB FOUNDATION, Seoul (KR)

( * ) Notice: Subject to any disclaimer, the term of this patent is extended or adjusted under 35 U.S.C. 154(b) by 0 days.

(21) Appl. No.: 15/916,097

(22) Filed: Mar. 8, 2018

(65) Prior Publication Data

US 2018/0197615 A1 Jul. 12, 2018

Related U.S. Application Data

(62) Division of application No. 15/343,135, filed on Nov. 3, 2016, now Pat. No. 9,947,413.

(30) Foreign Application Priority Data

Nov. 5, 2015 (KR) .......................... 10-2015-0155418

(51) Int. Cl.
*G11C 16/04* (2006.01)
*G11C 16/20* (2006.01)
*G11C 16/34* (2006.01)

(52) U.S. Cl.
CPC .......... *G11C 16/20* (2013.01); *G11C 16/0483* (2013.01); *G11C 16/3459* (2013.01)

(58) Field of Classification Search
CPC . G11C 16/0441; G11C 16/0483; G11C 16/12; G11C 16/20; G11C 16/3459
See application file for complete search history.

(56) References Cited

U.S. PATENT DOCUMENTS 9,685,235 B2 * 6/2017 Park ........................ G11C 16/20
2008/0316820 A1 * 12/2008 Seol .................... G11C 11/5628
365/185.03

(Continued)

FOREIGN PATENT DOCUMENTS

KR 10-2013-0097592 A 9/2013

*Primary Examiner* — Hien Nguyen

(57) ABSTRACT

A method of initializing and programming a 3D non-volatile memory device includes applying a first program voltage to a selected string selection line coupled to a selected memory layer among the plurality of memory layers; verifying whether threshold voltages of a plurality of string selection transistors reach a target value to determine the plurality of string selection transistors as programmed string selection transistors or unprogrammed string selection transistors; programming memory cell transistors of one or more of memory strings coupled with the programmed string selection transistors to have a predetermined threshold voltage, by applying a second program voltage to a selected wordline among the plurality of wordlines; and program-inhibiting channel lines of the programmed string selection transistors using the programmed memory cell transistors as screening transistors and applying a third program voltage to the selected string selection line to selectively program the unprogrammed string selection transistors.

7 Claims, 16 Drawing Sheets

(56) References Cited

U.S. PATENT DOCUMENTS

2013/0250677 A1* 9/2013 Nam ................ G11C 13/0002
                                                    365/185.03
2017/0125109 A1* 5/2017 Park ................ G11C 16/0483

* cited by examiner

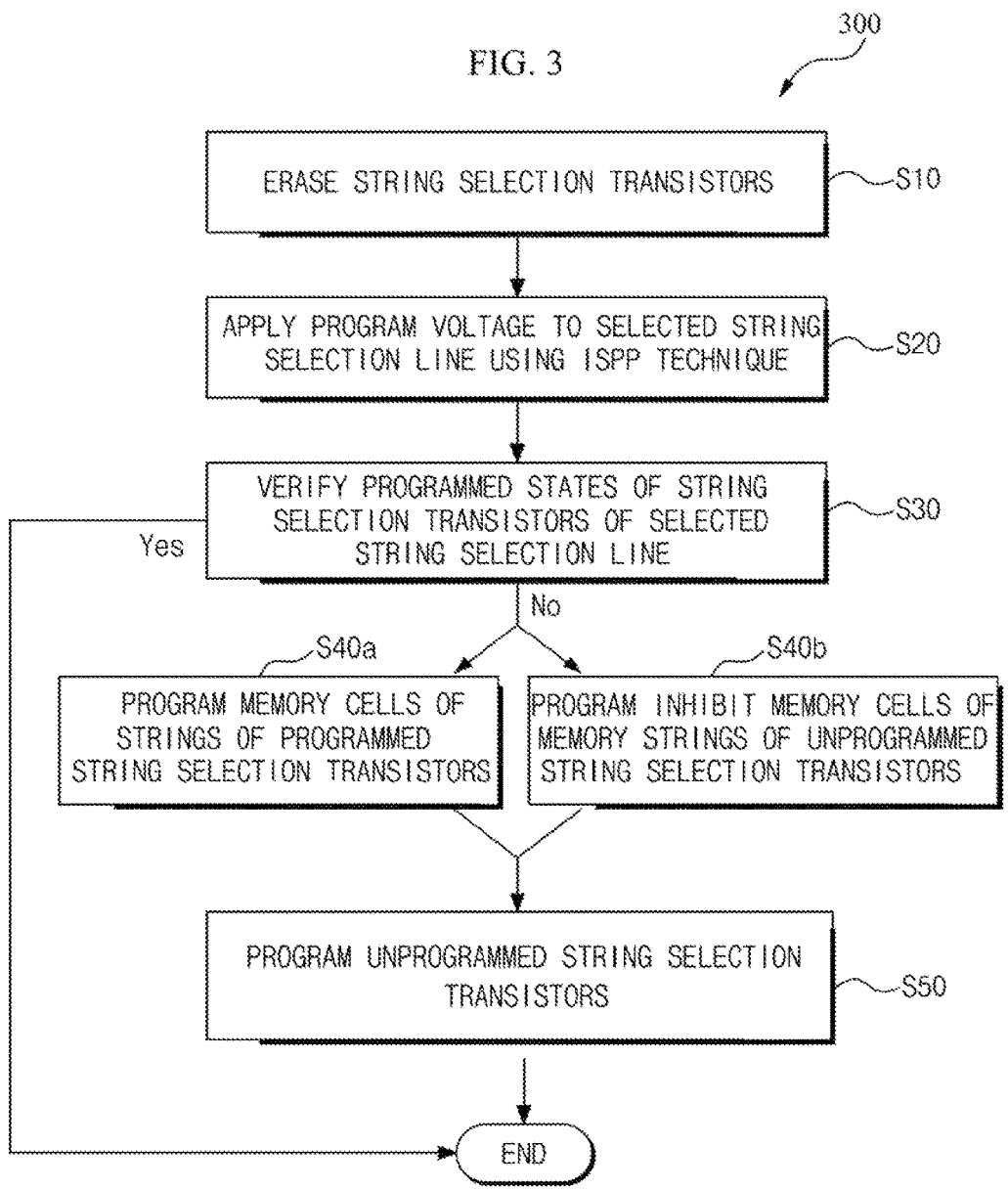

METHOD OF INITIALIZING AND PROGRAMMING 3D NON-VOLATILE MEMORY DEVICE

CROSS-REFERENCE TO RELATED APPLICATION

This application is a divisional of U.S. application Ser. No. 15/343,135, filed Nov. 3, 2016, which claims the benefit of Korean Patent Application No. 10-2015-0155418, filed on Nov. 5, 2015, in the Korean Intellectual Property Office, the disclosure of which is incorporated herein in its entirety by reference. This application is related to U.S. patent application Ser. No. 15/342,039, filed on Nov. 2, 2016, and titled "METHOD OF INITIALIZING AND PROGRAMMING 3D NON-VOLATILE MEMORY DEVICE".

BACKGROUND

1. Field

Embodiments of the present disclosure relate to a semiconductor technique, and more particularly, to a method of initializing and programming a 3D non-volatile memory device.

2. Description of the Related Art

Due to increasing demands for portable application devices, such as digital cameras, smart phones, and tablet PCs, and replacement of conventional hard disk drives with solid-state drives (SSDs), markets for non-volatile memory devices are rapidly growing. Among these non-volatile memory devices, NAND flash memory devices are popular due to low manufacturing cost for a high degree of integration.

Recently, downscaling the NAND flash memory device with a conventional two-dimensional (2D) memory cell array architecture has become more difficult as 20 nm or smaller photolithography techniques have reached their limits. In addition, design issues, which are related to reduction of a sensing margin in accordance with reduction of a number of electrons stored in a data storage element (e.g., a floating gate), and related to disturbances between memory cells, have become barriers against the downscaling.

To address the issues for downscaling the NAND flash memory devices, various 3D NAND flash array structures have been suggested. For example, the Korean Patent Laid-Open Gazette No. 10-2011-011166 discloses a "Layer selection by erase operation (LASER)" structure having a channel-stacked array architecture, the entire disclosure thereof is incorporated herein in its entirety by reference. Unlike conventional 2D flat-panel type memory arrays, the 3D LASER structure requires a memory layer selection with respect to stacked memory layers for a read operation, a write operation, or an erase operation, where the memory layer selection may be performed based on various combinations of string selection transistors. As another example for the 3D NAND flash memory devices, a 3D NAND flash memory device having memory layer selecting mechanism based on "layer selection by multi-level operation (LSM)" using multi-level string selection transistors has been suggested.

To select a memory layer in the various 3D NAND flash memory devices, such as based on the LASER structure and the LSM structure, it is desirable to program or initialize string selection transistors to cause them to have certain threshold values. It is required to obtain a sharp distribution of threshold values of programmed string selection transistors, and further desirable to program the string selection transistors without an interlayer disturbance of between memory arrays. In addition, while a programming bias is applied to a selected wordline coupled with a selected memory cell to program the selected memory cell, for a reliable program operation on the selected memory cell, it is preferable not to cause any disturbance to other memory cells sharing the selected wordline.

SUMMARY

Embodiments of the present disclosure include a method of initializing a 3D non-volatile memory device for initializing string selection transistors, such that the string selection transistors have threshold values exhibiting a sharp distribution and may be programmed to multi levels.

Embodiments of the present disclosure also include a method of reliably programming a 3D non-volatile memory device for programming selected memory cells without a disturbance between the selected memory cell and unselected memory cells by using initialized string selection transistors.

According to an aspect of the present disclosure, a method of initializing a 3D non-volatile memory device having a plurality of string selection lines, a plurality of wordlines, a ground selection line, and a plurality of memory layers, each of the memory layers comprising a plurality of channel lines respectively coupled to a plurality of bitlines via first ends of the plurality of channel lines and coupled to a common source line of the memory layer via second ends of the plurality of channel lines, wherein the plurality of string selection lines, the plurality of wordlines, and the ground selection line intersect with the plurality of channel lines, and each of the plurality of channel lines defines a memory string, may be provided.

The method may include applying a first program voltage to a selected string selection line coupled to a selected memory layer among the plurality of memory layers, the selected string selection line being coupled to a plurality of string selection transistors; verifying whether threshold voltages of the plurality of string selection transistors reach a target value to determine the plurality of string selection transistors as programmed string selection transistors or unprogrammed string selection transistors; programming memory cell transistors of one or more of memory strings coupled with the programmed string selection transistors to have a predetermined threshold voltage, by applying a second program voltage to a selected wordline among the plurality of wordlines, the predetermined threshold voltage being suitable to make each of the programmed memory cell transistors function as a screening transistor; and program-inhibiting channel lines of the programmed string selection transistors using the programmed memory cell transistors as screening transistors and applying a third program voltage to the selected string selection line to selectively program the unprogrammed string selection transistors.

In an example, the applying the first program voltage, verifying whether the threshold voltages of the plurality of string selection transistors reach the target value, and applying the third program voltage respectively may include performing an incremental step pulse programming (ISPP) technique. In an embodiment, the plurality of selection transistors coupled with the selected string selection line may be a first plurality of string selection transistors, and the method may further include, before applying the first program voltage is performed, erasing a second plurality of string selection transistors coupled with the plurality of string selection lines and a plurality of memory cell transistors coupled with the plurality of wordlines, the second plurality of string selection transistors including the first plurality of string selection transistors.

The verifying whether the threshold voltages of the plurality of string selection transistors reach the target value may include applying a sensing voltage to the plurality of bitlines; and applying a voltage substantially equal to the sensing voltage to common source lines of unselected memory layers among the plurality of memory layers. The programming the memory cell transistors of the one or more of memory strings coupled with the programmed string selection transistors may include program-inhibiting a memory cell transistor of a memory string coupled with a corresponding one of the unprogrammed string selection transistors.

In an embodiment, the programming the memory cell transistors may further include applying a voltage equal to or higher than a common collector voltage to a bitline coupled with the corresponding one of the unprogrammed string selection transistors to induce channel potential boosting at the memory string coupled with the corresponding unprogrammed string selection transistor. In addition, the program-inhibiting the channel lines of the programmed string selection transistors may include applying a ground voltage to a common source line of the selected memory layer, and applying a common collector voltage to common source lines of unselected memory layers among the plurality of memory layers and to the plurality of bitlines to float channel lines of memory strings of the unselected memory layers.

The program-inhibiting the channel lines of the programmed string selection transistors may include applying a voltage smaller than the threshold voltages of the programmed memory cell transistors to the selected wordline coupled with the programmed memory cell transistors, and applying the third program voltage to the selected string selection line to selectively program the unprogrammed string selection transistors.

The 3D non-volatile memory device may have a channel stacked structure, a straight-shaped bit cost scalable (BiCs) structure, a pipe-shaped BiCs structure, or a combination thereof. The 3D non-volatile memory device may be a NAND flash memory device.

In other embodiment, the method of initializing a 3D non-volatile memory device method may include applying a first program voltage to a selected string selection line in a selected memory layer among the plurality of memory layers; verifying whether threshold voltages of a plurality of string selection transistors coupled with the selected string selection line reach a target value to determine the plurality of string selection transistors as programmed string selection transistors or unprogrammed string selection transistors; applying a voltage equal to or higher than a common collector voltage to first bitlines coupled with the unprogrammed string selection transistors to induce channel potential boosting at memory strings respectively coupled with the unprogrammed string selection transistors; applying a ground voltage to second bitlines respectively coupled with the programmed string selection transistors, and applying a second program voltage to a selected wordline among the plurality of wordlines to program memory cell transistors in memory strings respectively coupled with the programmed string selection transistors to cause the programmed memory cell transistors to have a predetermined threshold voltage; and selectively programming the unprogrammed string selection transistors by turning the programmed memory cell transistors off and applying a third program voltage to the selected string selection line.

In an example, the applying the first program voltage, verifying whether the threshold voltages of the plurality of string selection transistors reach the target value, and selectively programming the unprogrammed string selection transistors respectively may include performing an incremental step pulse programming (ISPP) technique. In addition, the programmed memory cell transistors may be a first plurality of memory cell transistors, and the method further include, before applying the first program voltage is performed, erasing the plurality of string selection transistors and a second plurality of memory cell transistors, the second plurality of memory cell transistors including the first plurality of memory cell transistors.

The verifying whether the threshold voltages of the plurality of string selection transistors reach the target value may include applying a sensing voltage to the plurality of bitlines; and applying a voltage substantially equal to the sensing voltage to common source lines of the unselected memory layers among the plurality of memory layers. The selectively programming the unprogrammed string selection transistors may include applying a ground voltage to a common source line of the selected memory layer, applying a common collector voltage to common source lines of unselected memory layers among the plurality of memory layers and to the plurality of bitlines to float channel lines of memory strings of the unselected memory layers.

The 3D non-volatile memory device may have a channel stacked structure, a straight-shaped bit cost scalable (BiCs) structure, a pipe-shaped BiCs structure, or a combination thereof. The memory strings may be a NAND flash memory device.

In another example, the method of initializing a 3D non-volatile memory device may include applying a first program voltage to a selected string selection line in a selected memory layer among the plurality of memory layers; verifying whether threshold voltages of a plurality of string selection transistors coupled with the selected string selection line reach a target value to determine the plurality of string selection transistors as programmed string selection transistors or unprogrammed string selection transistors; applying a voltage equal to or higher than a common collector voltage to first bitlines coupled with the unprogrammed string selection transistors to induce channel potential boosting at memory strings respectively coupled with the unprogrammed string selection transistors; applying a ground voltage to second bitlines coupled with the programmed string selection transistors, and applying a second program voltage to a dummy ground line to program dummy ground transistors in memory strings respectively coupled with the programmed string selection transistors to have a predetermined threshold voltage; and selectively programming the unprogrammed string selection transistors by turning the programmed dummy ground transistors off and applying a third program voltage to the selected string selection line.

The applying the first program voltage, verifying whether the threshold voltages of the plurality of string selection transistors reach the target value, and selectively programming the unprogrammed string selection transistors respectively may include performing an incremental step pulse programming (ISPP) technique. The plurality of selection transistors coupled with the selected string selection line may be a first plurality of string selection transistors, and the method may further include, before applying the first program voltage is performed, erasing a second plurality of string selection transistors coupled with the plurality of string selection lines and a plurality of dummy ground transistors coupled with the dummy ground line, the second plurality of string selection transistors including the first plurality of string selection transistors.

The verifying whether the threshold voltages of the plurality of string selection transistors reach the target value includes: applying a sensing voltage is applied to the plurality of bitlines; and applying a voltage substantially equal to the sensing voltage is to common source lines of the unselected memory layers among the plurality of memory layers. The selectively programming the unprogrammed string selection transistors may include applying a ground voltage to a common source line of the selected memory layer, applying a common collector voltage to common source lines of the unselected memory layers among the plurality of memory layers and to the plurality of bitlines to float channel lines of memory strings of the unselected memory layers. The 3D non-volatile memory device may have a channel stacked structure, a straight-shaped bit cost scalable (BiCs) structure, a pipe-shaped BiCs structure, or a combination thereof. The memory strings may be a NAND flash memory device.

In one example, a method of programming a 3D non-volatile memory device may be provided. The method may include selecting any one of the plurality of memory layers; and applying a first program voltage to a bitline coupled to a selected memory string among a plurality of memory strings of the selected memory layer, applying a program inhibition voltage higher than the first program voltage to bitlines coupled to unselected memory strings among the plurality of memory strings, and applying a second program voltage to a wordline coupled with a selected memory cell to program the selected memory cell coupled to the selected memory string.

The program voltage may be a ground voltage. The program inhibition voltage may be a common collector voltage. In an example, a common collector voltage may be applied to common source lines of unselected memory layer among the plurality of memory layers. In an example, the 3D non-volatile memory device may have a channel stacked structure, a straight-shaped bit cost scalable (BiCs) structure, a pipe-shaped BiCs structure, or a combination thereof. The memory strings may be a NAND flash memory device.

BRIEF DESCRIPTION OF THE DRAWINGS

Hereinafter, embodiments of the present disclosure will be described in greater detail with reference to the accompanying drawings.

FIG. 3 is a flowchart showing a process of initializing string selection transistors of a 3D non-volatile memory device according to an embodiment the present disclosure.

DETAILED DESCRIPTION

Figure 1:
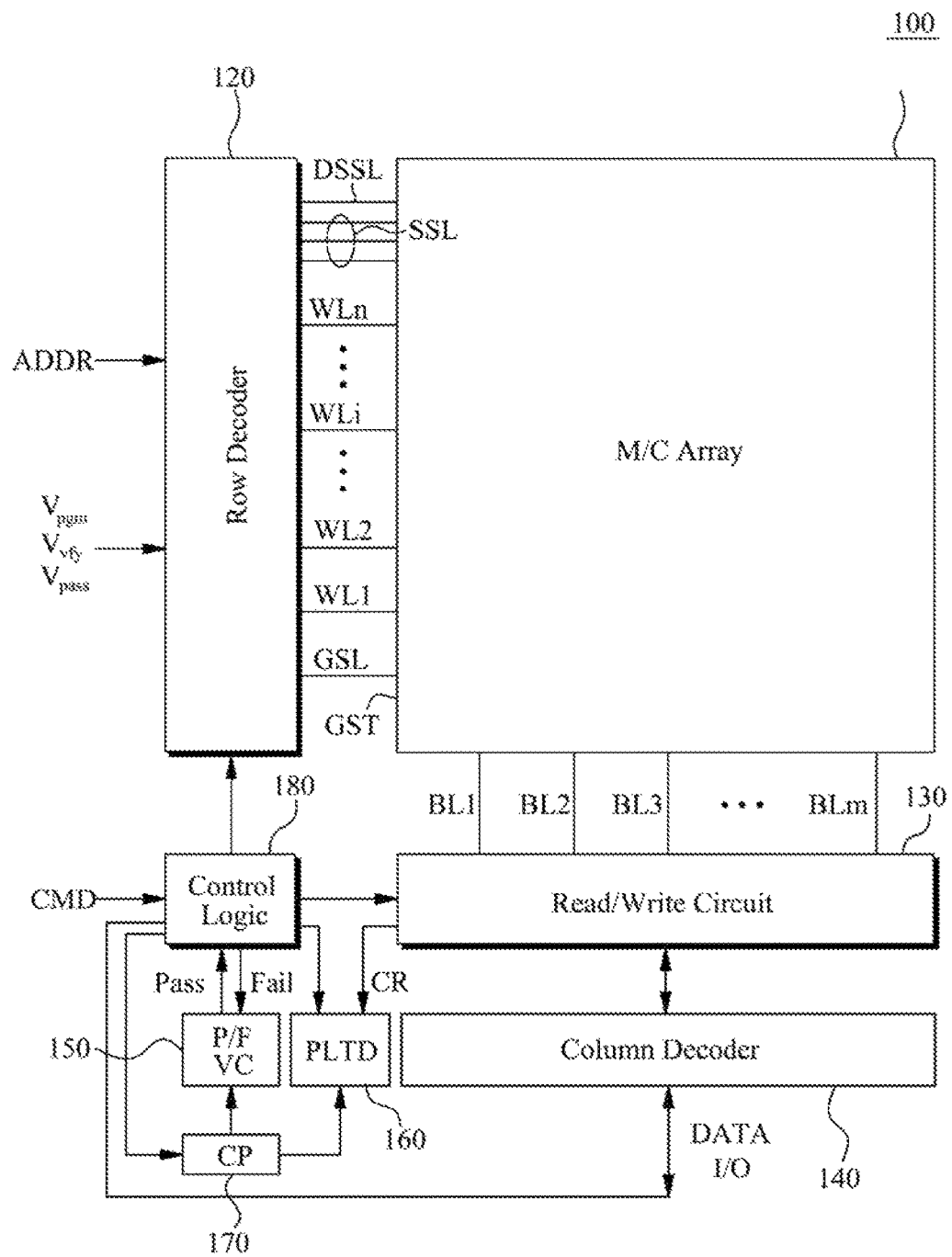
FIG. 1 is a block diagram showing a 3D non-volatile memory device according to an embodiment of the present disclosure.

Embodiments of the present disclosure will now be described more fully with reference to the accompanying drawings, in which illustrative embodiments are shown. Embodiments of the present disclosure may, however, be embodied in many different forms and should not be construed as being limited to the embodiments set forth herein; rather, these embodiments are provided so that this disclosure will be thorough and complete, and will fully convey the concept of the invention to those skilled in the art.

Like numbers refer to like elements throughout. As used herein, the term "and/or" includes any and all combinations of one or more of the associated listed items.

The terminology used herein is for the purpose of describing particular embodiments only and is not intended to be limiting of the invention. As used herein, the singular forms "a", "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element or layer is referred to as being "on" another element or layer, the element or layer can be directly on another element or layer or intervening elements or layers. In contrast, when an element is referred to as being "directly on" another element or layer, there are no intervening elements or layers present. Furthermore, a structure or a shape "adjacent to" another shape may overlap with the adjacent shape or be arranged below the adjacent shape.

The relative terms including "below," "above," "upper," "lower," "horizontal," and "vertical" may be used to describe a relationship between an element, a layer, or a region and another element, another layer, or another region as shown in the drawings. It should be understood that the terms are not limited to the orientations shown in the drawings.

FIG. 1 is a block diagram showing a 3D non-volatile memory device 100 according to an embodiment of the present disclosure.

Referring to FIG. 1, the 3D non-volatile memory device 100 may include a memory cell array 110 having a plurality of memory cells, a row decoder 120, a read/write circuit 130, and a column decoder 140 The memory cell array 110 may be connected to the row decoder 120 via wordlines WL1 to WLn, string selection lines SSL, dummy string selection line DSSL, and a ground line GSL. Furthermore, the memory cell array 110 may be connected to the read/write circuit 130 via bitlines BL1 to BLm.

If the 3D non-volatile memory device 100 is a NAND flash memory device, the memory cell array 110 may include memory cell strings (not shown) in which a plurality of memory cells are electrically connected in series. A dummy string selection transistor (e.g., an NMOS select transistor) for interconnecting a bitline and a memory cell string, and at least two or more string selection transistors connected to the dummy string selection transistor in series may be disposed at first ends of the memory cell strings. Second ends of the memory cell strings may be connected to a common source line, and a ground selection transistor GST to be connected to the common source line may be provided at the second ends of the memory cell strings.

The wordlines WL1 to WLn may be connected to control gates of memory cells arranged in a column-wise direction, respectively. The bitlines BL1 to BLm may be connected to the first ends of the string selection transistors, respectively.

A plurality of memory cells having control gate electrodes coupled with the respective wordlines WL1 to WLn, in a row-wise direction may constitute a logical page, where a number of logical pages may be determined by a storage capacity of the memory cells. For example, in accordance with a level of the storage capacity, one or more of a single level cell (SLC) memory device, in which each memory cell stores 1 bit, a multi level cell (MLC) memory device, in which each memory cell stores 2 bits, an eight level cell (8LC) memory device, in which each memory cell stores 3 bits, and a sixteen level cell (16LC) memory device, in which each memory cell stores 4 bits, may be provided.

Memory cells of the memory cell array 110 may be arranged in a 2D array structure that is disposed substantially parallel to a main surface of a semiconductor substrate, or a 3D array structure having a channel perpendicular to a main surface of a semiconductor substrate or one or more memory array layers stacked in a vertical direction of the main surface of the semiconductor substrate. For example, the 3D array structure in accordance with an embodiment of the present disclosure may be a channel stacked structure, a straight-shaped bit cost scalable (BiCs) structure, or a pipe-shaped BiCs structure, where various memory layer selecting method described below may be applied to the structures. However, the above-described structures are merely examples, and embodiments of the present disclosure are not limited thereto.

The memory cells constituting a page may be programmed in an identical program cycle. For example, memory cells connected to a first wordline WL1 may be programmed to have an identical program state (or have a target value) in the same program cycle. Alternatively, the memory cells connected to the wordline WL1 may be programmed to have different program states, for example, in a single program cycle, a first memory cell may be programmed to have a first program state P1, a second memory cell adjacent to the first memory cell may be programmed to have a second program state P2, and other memory cells may be programmed to have a third program state P3. However, embodiments of the present disclosure are not limited thereto. In other embodiment having a single level cell (SLC) device has an interleaved architecture, and even-numbered cells and odd-numbered cells may constitute two different pages, respectively. For example, a 4 kb SLC device may include wordlines for 65,536 memory cells. Furthermore, in embodiments having an MLC device, since each cell stores one least significant bit (LSB) and one most significant bit (MSB), the MLC device has four pages. For example, in such an embodiment, MSB pages and LSB pages on even-numbered bitlines and MSB pages and LSB pages on odd-numbered bitlines, respectively, may be provided.

The row decoder 120 may control the plurality of string selection lines SSL and the dummy string selection line DSSL, thereby performing initialization of string selection transistors of a memory layer. Detailed descriptions thereof will be given below. The row decoder 120 may select a plurality of string selection lines SSL or, at the same time, may drive the plurality of string selection lines SSL by applying a voltage or a current thereto.

Furthermore, the row decoder 120 may select any one of wordlines of a memory block. The row decoder 120 may apply a wordline voltage generated by a voltage generator (not shown) to the selected wordline of the selected memory block. During a programming operation using an incremental step pulse programming (ISPP) technique, the row decoder 120 may apply a program voltage $V_{pgm}$ and a verification voltage $V_{vfy}$ to a selected wordline and apply a pass voltage $V_{pass}$ to an unselected wordline.

The memory cell array 110 may be addressed by the bitlines BL1 to BLm via the column decoder 140. The read/write circuit 130 may receive data from an external circuit via the column decoder 140, or may transmit data to the external circuit via the column decoder 140.

The read/write circuit 130 may include a page buffer (not shown) and may operate as a sense amplifier or a write driver in accordance with operation modes. However, in the present specification, the words, "read/write circuit" and "page buffer" may be used as equivalent terms and shall be understood as interchangeable terms. During a program operation, the read/write circuit 130 receives data from an external circuit and transmits a bitline voltage corresponding to the received data to a selected bitline of the cell array 110. During a read operation, the read/write circuit 130 may read out data stored in a selected memory cell via a selected bitline, latch the read out data, and output the latched data to the external circuit.

The read/write circuit 130 may perform a verification operation associated with a program operation on a selected memory cell in response to a transmission signal received from a control circuit (or a control logic) 180 and, in response to the transmission signal, may output a result of the verification operation as page buffer signals over a plurality of number of times. In accordance with an embodiment, the read operation of the read/write circuit 130 may be performed based on a charge integration using a bitline parasitic capacitor. In addition, the read/write circuit 130 may measure a string current or a voltage output to a bitline to verify a programming operation for initialization of string selection transistors using the ISPP technique. A verification process may be performed by a current sensing circuit (not shown) coupled with the bitline. According to an embodiment, the current sensing circuit (not shown) may be provided in the read/write circuit 130.

In an embodiment of the present disclosure, memory cells may be programmed page by page using the ISPP technique. A verification process for checking whether a threshold voltage of a programmed memory cell reaches a level of a target voltage may be performed by the current sensing circuit (not shown) coupled with the bitlines BL1 to BLm.

The control logic 180 may execute program-verify loops based on the ISPP technique, thereby programming selected memory cells and/or string selection transistors. A pass/fail verification circuit 150 verifies whether one or more of a programmed memory cell and string selection transistors are at a desired level every time when a program loop count increases. If one or more of the programmed memory cell and the programmed string selection transistors have a desired threshold voltage (i.e., a target value), it may be determined as a program pass, and then the program operation and the verification operation on the programmed memory cell and/or string selection transistor are terminated. However, if the programmed memory cell and/or string selection memory cell does not reach the target value, it may be determined as a program fail, and the pass/fail verification circuit 150 may generate a count signal (not shown). The pass/fail verification circuit 150 may determine a pass or a fail of the program operation, and then transmit the determined result to the control logic 180.

In response to a command CMD, the control logic 180 may control one or more of the row decoder 120, the read/write circuit 130, the column decoder 140, the pass/fail verification circuit 150, the program loop turn detector 160, and the comparator 170 to perform a pulsed program operation and a verification operation based on the ISPP technique. The program loop turn detector 160 and the comparator 170 may be circuits for determining whether a memory cell to be programmed, a string selection transistor to be programmed, or both are abnormally slow cells or abnormally fast cells. In other embodiments, the program loop turn detector 160 and the comparator 170 may be omitted.

The control logic 180 may determine whether to terminate or continue a program operation according to the pass or fail result transmitted from the pass/fail verification circuit 150. When the fail result is received from the pass/fail verification circuit 150, the control logic 180 may cause a voltage generator (not shown) to generate a program voltage $V_{pgm}$ which is increased by $\Delta V_{ISPP}$, and a verification voltage $V_{vfy}$, and cause a page buffer 130 to proceed a subsequent program loop. When the control logic 180 receives the pass result, a program operation on selected memory cell will be terminated.

In various designs, the control logic 180 may be integrated on the same chip with the memory cell array 110. However, embodiments of the present disclosure are not limited thereto. In an embodiment, the control logic 180 may be implemented in a different chip from the memory cell array 110. For example, as in a solid state drive (SSD), the control logic 180 may be provided at a flash translation layer (FTL), which is an independent chip separated from the memory cell array 110.

Furthermore, although the pass/fail verification circuit 150, the program loop turn detector 160, and the comparator 170 are configured to be separate elements from the control logic 180, as shown in FIG. 1, embodiments of the present disclosure are not limited thereto. For example, at least one of the pass/fail verification circuit 150, the program loop turn detector 160, and the comparator 170 may be implemented as software or hardware in the control logic 180. Furthermore, at least one of the pass/fail verification circuit 150, the program loop turn detector 160, and the comparator 170 may be omitted or another circuit component may be added.

Figure 2A:
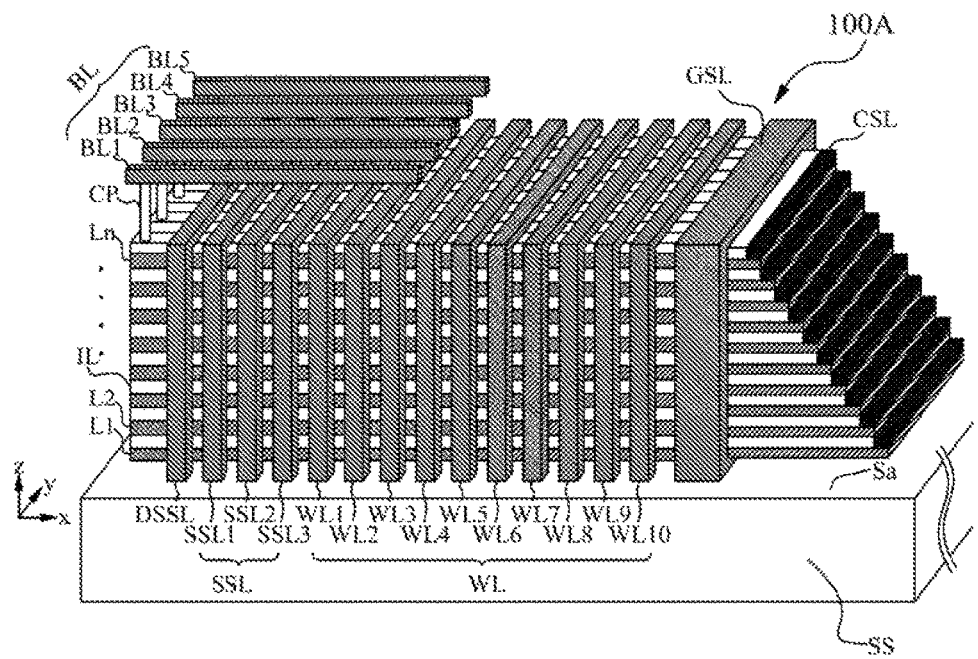
FIGS. 2A and 2B are perspective views showing 3D non-volatile memory devices including memory cell arrays according to various embodiments of the present disclosure.
Figure 2B:
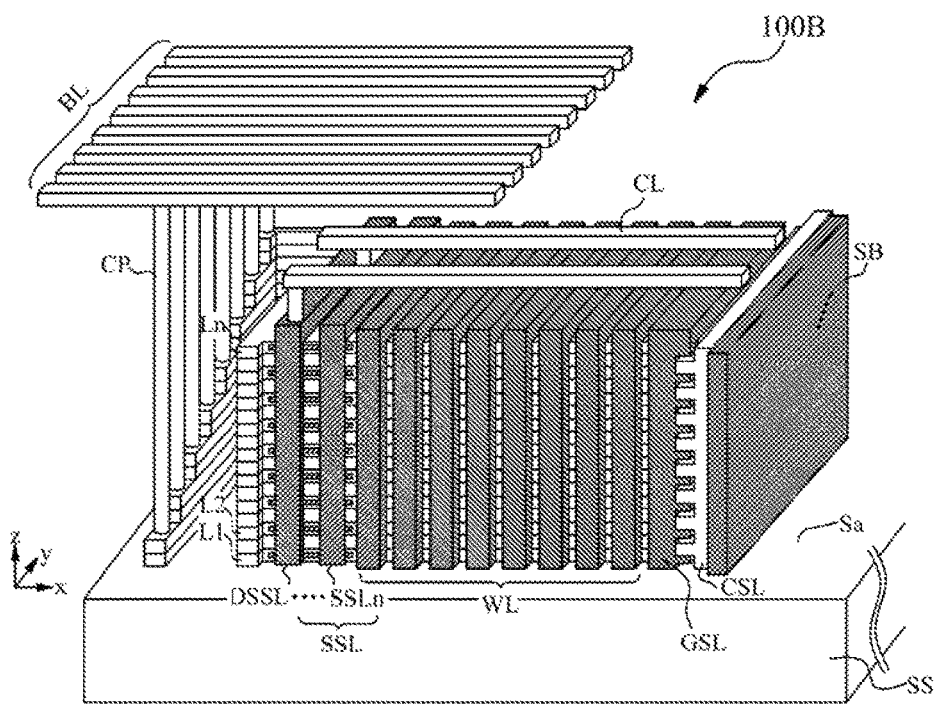

FIGS. 2A and 2B are perspective views showing 3D non-volatile memory devices 100A and 100B respectively including memory cell arrays (e.g., the memory cell array 110 of FIG. 1) according to various embodiments of the present disclosure.

Referring to FIG. 2A, the 3D non-volatile memory device 100A may include memory cells that are arranged by being aligned in a first direction (e.g., an x-axis direction) and a second direction (e.g., a y-axis direction) that are parallel to a main surface Sa of a substrate SS, and in a third direction (e.g., a z-axis direction) perpendicular to the main surface Sa of the substrate SS. The memory cells included in one of memory layers L1 to Ln are arranged on the x-y plane of FIG. 2A, but embodiments are not limited thereto. For example, the memory cells may be arranged on a z-x plane or a y-z plane perpendicular to the substrate SS. The substrate SS is not limited to a semiconductor substrate, such as a Si monocrystalline substrate, a compound semiconductor substrate, a SOI substrate, and a strained substrate, but may be a ceramic substrate, a polymer substrate for implementing a flexible device, or a fabric layer.

The first direction (e.g., the x-axis direction) and the second direction (e.g., the y-axis direction) may be orthogonal to each other. To form the above-described memory cells, a plurality of memory layers L1 to Ln are stacked by interposing interlayer insulation layers IL therebetween. Each of the plurality of memory layers L1 to Ln may include a plurality of channel lines that respectively extend in the x-axis direction and adjacent channel lines are separated from each other at a predetermined distance in the y-axis direction. According to an embodiment, the plurality of channel lines may be semiconductor material layers each having a line shape. In the semiconductor material layers, suitable impurity regions and channel regions may be formed to provide source/drain regions of one or more dummy string selection transistor, a plurality of string selection transistors, memory cell transistors, or ground selection transistors as will be described below. However, embodiments of the present disclosure are not limited thereto. For example, the memory cell transistors may be junctionless or junction-free memory cell transistors. In this case, impurity regions for forming junctions may be omitted.

In an embodiment, the semiconductor material layer may contain a suitable n-type polysilicon, a polysilicon, or a p-type polysilicon according to a memory cell arrays architecture, such as a bit cost scalable (BiCs) structure, a vertical-recess-array-transistor (VRAT) structure, or a terabit cell array transistor (TCAT) structure. In accordance with another embodiment, the channel lines may be formed of a monocrystalline silicon, a compound semiconductor, a carbon-based material, a polymer material, or any of various other suitable channel materials other than conventional semiconductor materials.

Bitlines BL may be coupled with first ends of the plurality of channel lines, respectively. One bitline may be commonly coupled with first ends of corresponding channel lines of the memory layers L1 to Ln, and the corresponding channel lines are arranged in the z-axis direction to share the coupled bit line, and the sharing of the bitline by the channel lines can be secured via an interlayer conductive member, such as a via plug CP.

Common source lines CSL may be respectively connected to second ends of the plurality of channel lines. The common source lines CSL electrically connected to the second ends of the plurality of channel lines may be patterned to have a stair shape including steps, and a predetermined bias may be independently applied to a selected semiconductor layer by forming contact plugs (not shown) that contact respective steps of the common source lines CSL.

A plurality of wordlines WL may each extend in the y-axis direction and the z-axis direction, and adjacent wordlines WL are separated with each other at a predetermined distance in the x-axis direction. The plurality of wordlines WL may intersect with a plurality of channel lines in respective memory layers L1 to Ln to be shared by memory cells in the y-axis direction in the respective memory layers L1 to Ln. In this case, conductive layers constituting the plurality of wordlines WL may intersect with the plurality of channel lines, and data storage layers for storing data may be interposed between the conductive layers and the plurality of channel lines. The conductive layers may have a gate all around structure for surrounding the data storage layers, or a double gate structure for passing over the data storage layers.

In accordance with an embodiment, each of the plurality of memory cells may include a charge storage layer, such as a floating gate or a charge trapping layer which may be insulated from a corresponding channel line and a corresponding wordline respectively via a tunnel insulation layer and a blocking insulation layer. The charge storage layer may function as a data storage layer. For example, each of the plurality of memory cells having the charge trapping layer may have any one of a polysilicon-silicon dioxide-silicon nitride-silicon dioxide-silicon (SONOS) structure, a polysilicon-alumina-silicon nitride-silicon dioxide-silicon (SANOS) structure, a tantalum or titanium nitride-alumina-silicon nitride-silicon dioxide-silicon (TANOS), a metal-alumina-silicon nitride-silicon dioxide-silicon (MANOS) structure, or a metal-alumina-silicon nitride-band engineered oxide-silicon (Be-MANOS) structure, and each of the plurality of memory cells may be stacked in an order of a gate electrode, a blocking insulation layer, a charge trapping layer, a tunnel insulation layer, and a substrate. However, they are merely examples, and the charge trapping layer is not limited to a silicon nitride layer and may be formed of various other suitable materials.

The conductive layers constituting the wordlines WL may extend onto the blocking insulation layer formed on the charge trapping layer. The plurality of memory cells may be electrically connected in series to constitute memory strings for a NAND flash memory device. Although the 3D non-volatile memory devices 100A of FIG. 2A includes 10 wordlines WL1 to WL10, it is merely an example, and a number of the wordlines WL may be the same as a number of memory cells included in a single string, e.g., 32 or 64.

In an embodiment, the 3D non-volatile memory device 100A may include two or more string selection transistors formed at each of the channel lines. In accordance with an embodiment, the string selection transistors may be multi-level transistors that have a plurality of programmable states respectively corresponding to a plurality of threshold values. In accordance with an embodiment, the string selection transistors may be formed of the same material, and also may have substantially the same structure as that of the memory cells.

FIG. 2A shows that three string selection transistors are provided for each single channel line and three string selection lines SSL1, SSL2, and SSL3 each extend in the y-axis and z-axis directions and adjacent string selection lines are separated from each other at a predetermined distance in x-axis direction. As a result, each of the string selection lines SSL1, SSL2, and SSL3 may be coupled with a corresponding plurality of string selection transistors that are arranged in a y-z plane. Similarly to the wordlines WL, the string selection lines SSL1, SSL2, and SSL3 may have a structure surrounding data storage layers or extending over the data storage layers for controlling threshold values of the string selection transistors formed on the plurality of channel lines. In that case, the string selection lines SSL1, SSL2, and SSL3 may be shared by the string selection transistors arranged in the y-axis direction and the z-axis direction of adjacent memory layers (or y-z planes).

Although the three string selection lines SSL1, SSL2, and SSL3 are shown in FIG. 2A, the number of string selection lines SSL is not limited thereto. The number of string selection lines SSL may be determined to allow independent selection of each of the memory layers L1 to Ln according to any combination of the number of the memory layers L1 to Ln and threshold values of the string selection transistors coupled with string selection lines SSL. Detailed descriptions thereof will be given below.

The string selection lines SSL1, SSL2, and SSL3 may pass across a plurality of memory layers L1 to Ln, where each of the string selection lines SSL1, SSL2, and SSL3 may be coupled in common with string selection transistors which are stacked in the z-axis direction and arranged in the y-axis direction (or are arranged in y-z planes), and control the string selection transistors to program, erase, or switch ON/OFF states of selected string selection transistors. In addition, when the initialization operation on the string selection transistors is completed, the string selection lines SSL may be driven to select an addressed memory layer by controlling the on/off states of the string selection transistors arranged in the x axis direction in each of the memory layer L1 to Ln. In an embodiment, the string selection lines SSL1, SSL2, and SSL3 may be arranged between first ends of memory strings coupled with the bitlines BL and a first wordline WL1.

One or more dummy string selection lines DSSL may be provided between the string selection lines SSL1, SSL2, and SSL3 and the bitline BL. The dummy string selection line DSSL may be coupled with a gate electrode of a dummy string selection transistor DSST formed at a corresponding channel line. The dummy string selection line DSSL may be provided for bitline selection during a programming operation for initializing the string selection transistors. Detailed descriptions thereof will be given below.

A ground selection line GSL may be disposed between the wordlines WL and the common source lines CSL. The ground selection line GSL passes across the plurality of memory layers L1 to Ln, where the ground selection line GSL may be coupled in common with ground select transistors stacked in the z-axis direction and arranged in the y-axis direction (or in y-z planes), to turn on or off the ground select transistors.

Referring to FIG. 2B, in accordance with another embodiment of the present disclosure, the 3D non-volatile memory device 100B may include memory cells that are arranged in a first direction (e.g., an x-axis direction) and a second direction (e.g., a y-axis direction), and in a third direction (e.g., a z-axis direction). Both of the x-axis direction and the y-axis direction are parallel to a main surface Sa of a substrate SS, and the z-axis direction perpendicular to the main surface Sa of the substrate SS. The above description on the string selection lines SSL, the dummy string selection line DSSL, the wordlines WL, and the ground selection line GSL of the 3D non-volatile memory device 100A of FIG. 2A may be similar to for those of the 3D non-volatile memory device 100B illustrated in FIG. 2B as long as there is no contradiction therebetween. In addition, in the 3D non-volatile memory device 100a and 100b, wordlines WL, ground selection line GSL as well as string selection lines SSL may be electrically connected with peripheral circuits (e.g., row decoder 120) via suitable interconnection conductors CL. The 3D non-volatile memory device 100B may include one or more dummy string selection lines DSSL, a plurality of string selection lines SSL, a plurality of wordlines WL, and a ground select line GSL, which intersect with a plurality of channel lines.

In the 3D non-volatile memory device 100B, a semiconductor body SB may be coupled with a common source line CSL. Although, in the embodiment of FIG. 2B, the common source line CSL, and the semiconductor body SB are sequentially arranged in the x-direction from the ground selection line GSL, it is merely an example, and, in another embodiment, the semiconductor body SB and the common source line CSL are sequentially arranged in the x-direction from the ground selection line GSL. The common source lines CSL may be also patterned to have a stair shape including steps, and contact plugs (not shown) contacting the respective steps are formed as described in FIG. 2A to apply a bias independently to a selected memory layer.

FIG. 3 is a flowchart illustrating a process 300 for initializing string selection transistors of a 3D non-volatile memory device according to an embodiment, and FIGS. 4A to 4F are circuit diagrams sequentially further illustrating the process 300 initializing string selection transistors SST of a 3D non-volatile memory device 100 or 100' according to an embodiment disclosure. FIG. 5A is a diagram showing a distribution of threshold values of string selection transistors according to an embodiment of the present disclosure, FIG. 5B is a timing diagram showing waveforms of signals applied to a 3D non-volatile memory device in operations S40a and S40b of the process 300 of FIG. 3, and FIG. 5C is a timing diagram showing waveforms of signals applied to a 3D non-volatile memory device in an operation S50 of the process 300 of FIG. 3.

Figure 4A:
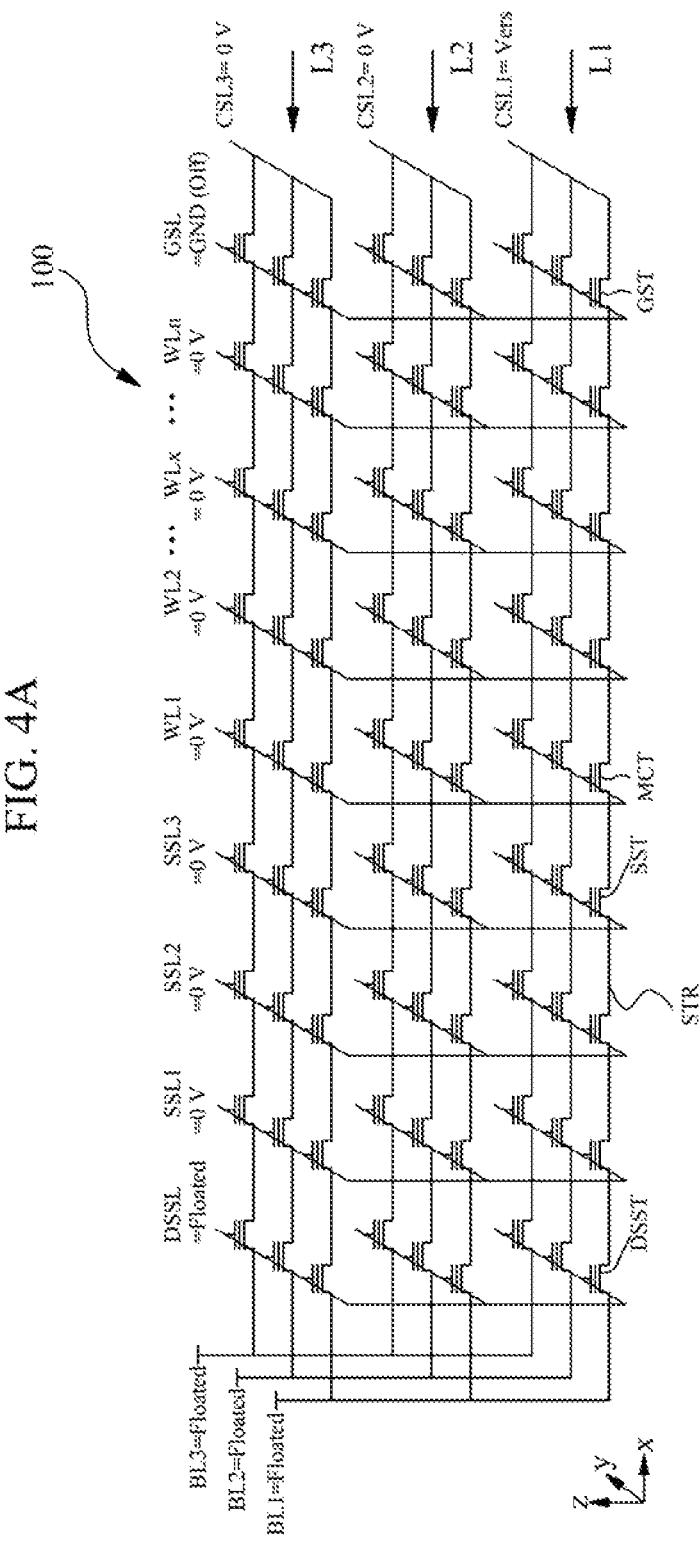
FIGS. 4A to 4F are circuit diagrams sequentially showing a process of initializing string selection transistors of a 3D non-volatile memory device according to an embodiment of the present disclosure.
Figure 5A:
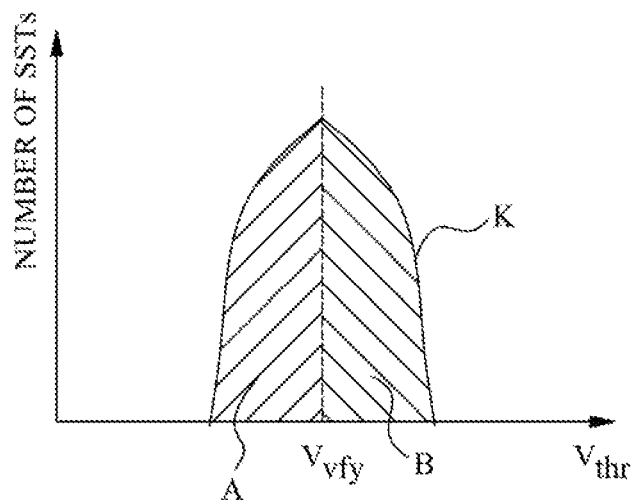
FIG. 5A is a diagram showing a distribution of threshold values of string selection transistors, which is measured in a first operation step of FIG. 3 according to embodiments of the present disclosure.
Figure 5B:
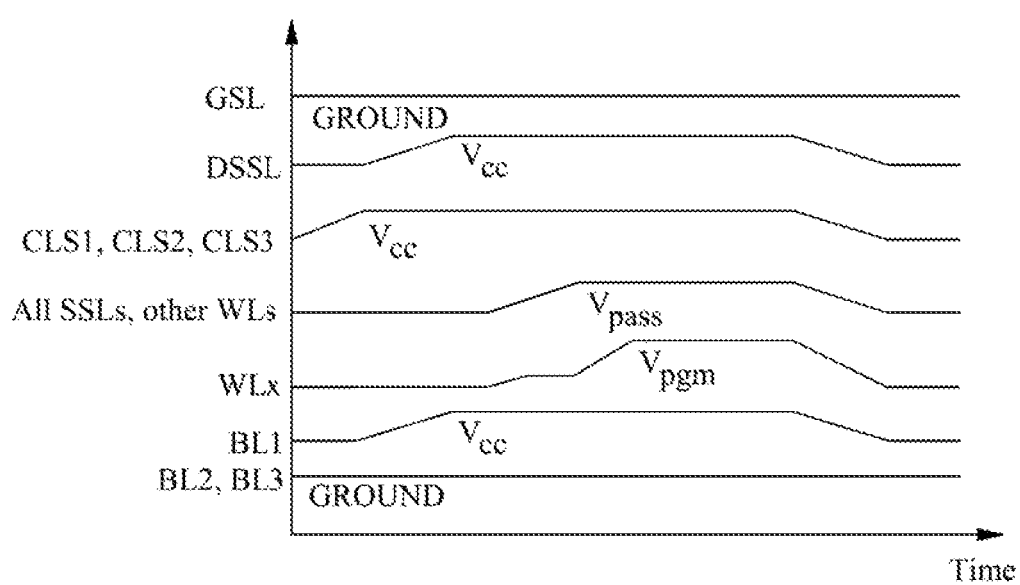
FIG. 5B is a timing diagram showing states of biases applied to a 3D non-volatile memory device in second and third operation steps.
Figure 5C:
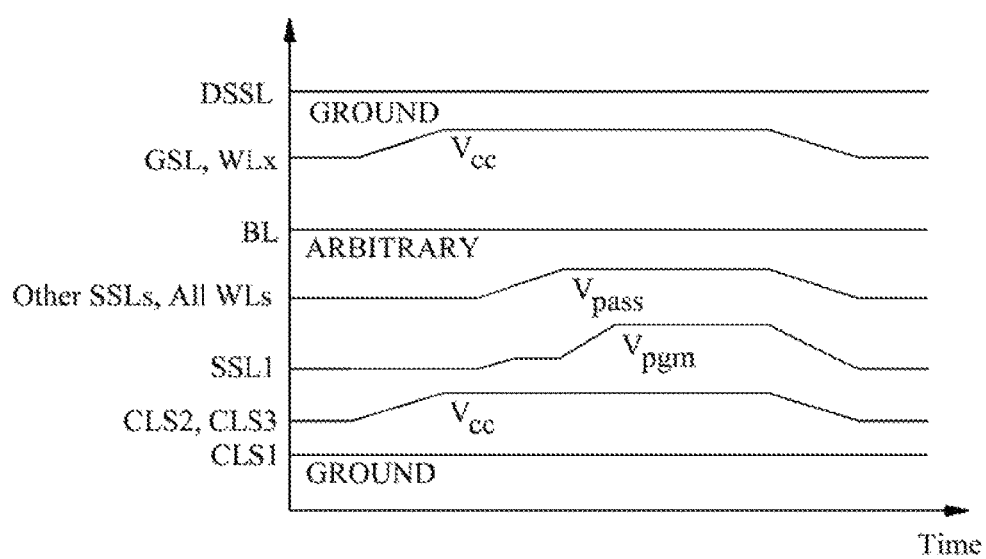
FIG. 5C is a timing diagram showing states of biases applied to a 3D non-volatile memory device in a fourth operation step.

Referring to FIGS. 3 and 4A, at S10, an erase operation is performed with respect to one or more of memory layers L1, L2, and L3. FIG. 4A shows an example in which an erase operation is performed on string selection transistors SST included in a selected memory layer L1. To this end, an erase voltage signal $V_{ers}$ may be applied to channel lines of the selected memory layer L1 via a common source line CSL1 and all bitlines BL1, BL2, and BL3 may be floated. A plurality of wordlines WL1 to WLn may be floated or grounded. A dummy string selection line DSSL may also be floated. In an embodiment, if the wordlines WL1 to WLn are grounded, memory cells in the selected memory layer L1 as well as the string selection transistors SST may be erased. The erase operation on the memory cells may replace an erase operation required during an operation for programming screen transistors as will be described below.

Because the string selection lines SSL1, SSL2, and SSL3 are grounded, an erase operation may be performed on the plurality of string selection transistors SST. In an embodiment, the erase operation may be performed using the ISPP technique by applying an erase voltage signals Vers in the form of incremental erase pulses, and after application of each erase pulse, a verification operation may be performed based on an ISPE (Incremental step pulse erase) scheme for verifying whether the erase operation on the string selection transistors SST has been properly performed, such that threshold values (or threshold voltages) of the string selection transistors SST may have a predetermined erase distribution. If the erase operation is successfully completed, the threshold values of the string selection transistors SST may be smaller than or equal to 0 V.

In an embodiment, the erase operation may be performed using a program before erase (PBE) technique. When the PBE technique is activated, the 3D non-volatile memory device 100 may program all of the string selection transistors SST coupled with the string selection lines SSL1, SSL2, and SSL3 and included in the memory layer L1 to have the same state. Specifically, the string selection transistors SST coupled with the string selection lines SSL1, SSL2, and SSL3 in the memory layer L1 may have substantially the same threshold voltage. Dummy string selection transistors DSST coupled with the dummy string selection line (DSSL) may not be programmed. Next, the erase operation as described above may be initiated with respect to the programmed string selection transistors SST. Furthermore, if desirable, to further reduce a width (e.g., a width corresponding to a standard deviation) of an erase distribution of the string selection transistors SST, a soft programming technique may be additionally performed on the erased string selection transistors SST.

Figure 4B:
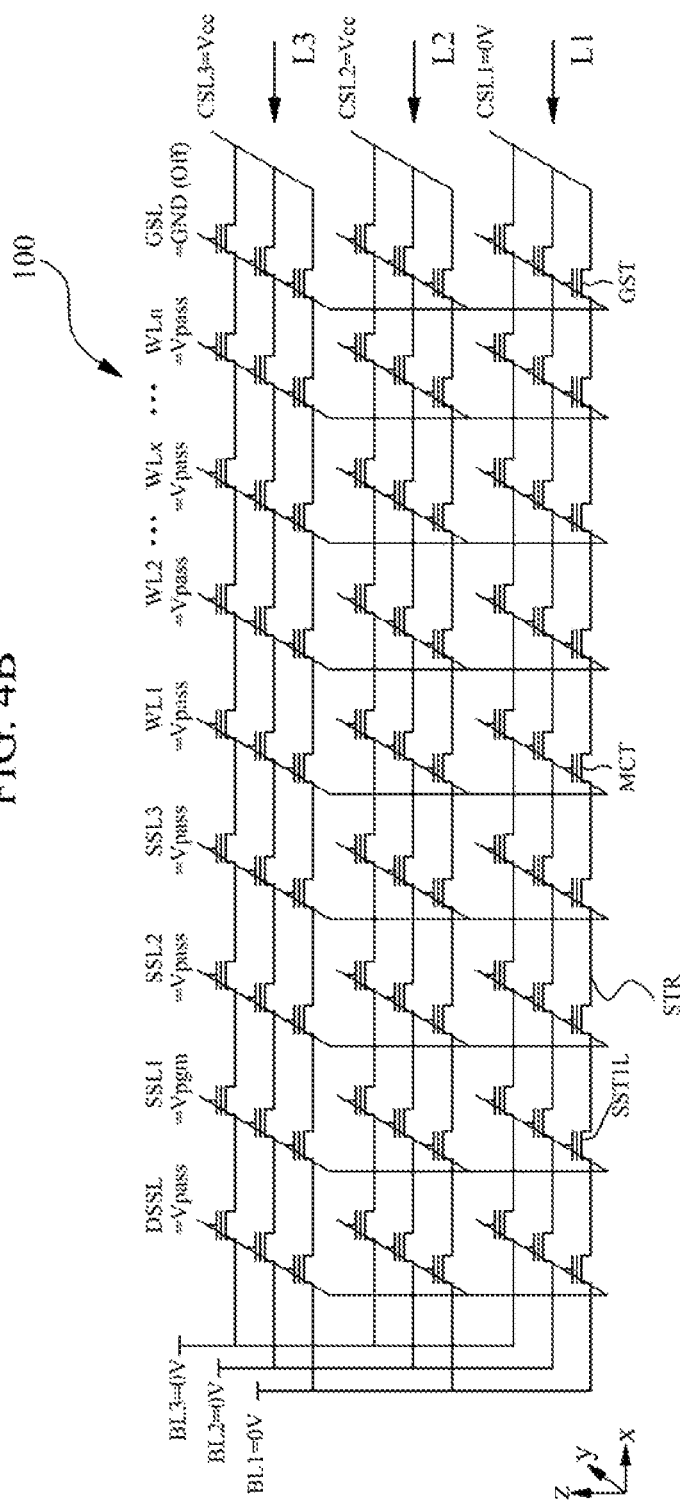

Next, referring to FIG. 3, at S20 (referred to hereinafter as a first programming operation), string selection transistors coupled with a selected string selection line of a selected memory layer are programmed to have one or more target states $V_{thr}$ by applying a program voltage thereto. FIG. 4B shows an example in which the selected memory layer is the first memory layer L1, a first string selection line SSL1 is selected, and string selection transistors SST1L of the selected memory layer L1 that are coupled with the selected string selection line SSL1 and arranged in a second direction (e.g., a y-axis direction) are programmed by applying a program voltage $V_{pgm}$ to the string selection line SSL1. In an example, the memory layer L1 may be selected by applying a ground voltage to the common source line CSL1, and the other memory layers L2 and L3 may be unselected by applying an increased voltage (e.g., common collector voltage, Vcc) to the common source lines CSL2 and CSL3.

In an embodiment, the selected string selection transistors SST1L may be programmed by using the ISPP technique. In this case, a first program pulse of an initial program loop, e.g., a voltage pulse having a level in a range from about 10 V to about 14 V, may be applied to the string selection line SSL1, and then a second program loop may be performed by applying a second program voltage $V_{pgm}$ increased by a predetermined value $\Delta V_{ISPP}$, e.g., in a range from about 0.2 V to about 1 V, to the string selection line SSL1. In subsequent program loops, the program voltage $V_{pgm}$ pulse is continuously increased by the predetermined value $\Delta V_{ISPP}$ as a number of the program loops increases, the increased voltage pulse will be repeatedly applied to the selected string selection line SSL1.

Referring back to FIG. 3, at S30, in the program loops, a verification operation for determining whether threshold values of the programmed string selection transistors SST1L reach a target value (or a target threshold voltage) $V_{thr}$ by applying a verification voltage (e.g., the verification voltage $V_{vfy}$ of FIG. 4C) to the string selection line SSL1 after the first program operation is performed. By performing the verification operation S30, programmed string selection transistors and unprogrammed string selection transistors may be detected. The verification operation S30 may be performed in combination with a coarse-fine sensing scheme or a fine-sensing scheme. However, embodiments of the present disclosure are not limited thereto.

If it is determined in the verification operation S30 that the programmed string selection transistor SST1L coupled with the string selection line SSL1 have reached the target threshold voltage $V_{thr}$, a program inhibition may be performed on the string selection transistor SST1L determined as having reached the target threshold voltage, and the determined string selection transistor may be excluded in a subsequent program loop. If not, a next program loop may be performed by applying a program voltage increased by the predetermined value $\Delta V_{ISPP}$ to the string selection transistor SST1L determined as not having reached the target voltage.

In an embodiment, a sensing circuit (not shown) of the page buffer (e.g., the page buffer 130 of FIG. 1) may detect an ON/OFF state of a selected string selection transistor SST1L via a bitline of the string selection transistor SST1L and provide a detected result to the pass/fail verification circuit 150 of FIG., and thus the verification operation S30 may be performed.

Figure 4C:
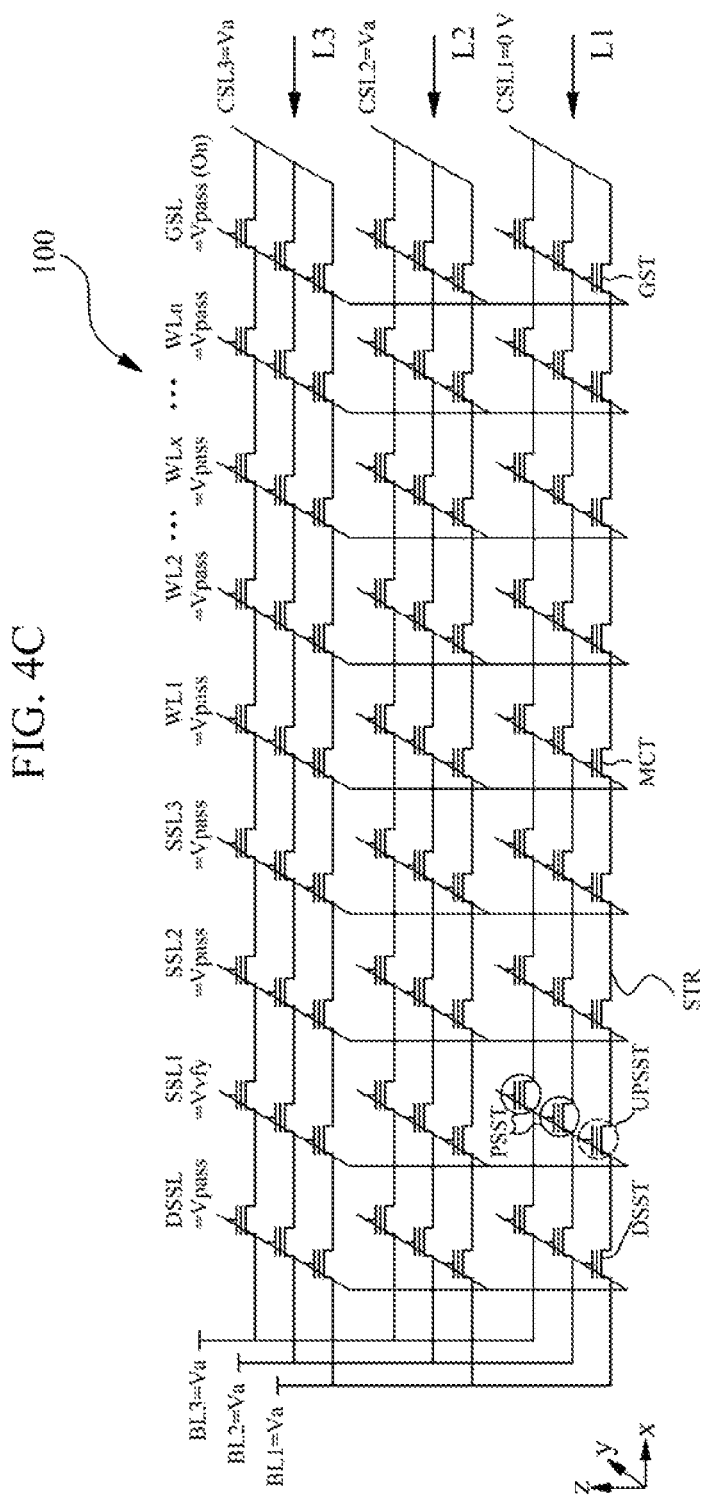

FIG. 4C illustrates performing the verification operation S30 of FIG. 3 on the string selection transistors arranged in a second direction (e.g., the y-axis direction) of the selected memory layer L1. A sensing voltage Va, e.g., 0.7 V, is applied to the bitlines BL1 to BL3 to pre-charge channel lines. The sensing voltage Va may be used for pre-charging capacitive components (e.g., parasitic capacitance) of the bitlines BL.

A pass voltage $V_{pass}$, for example, may be applied to the dummy string selection transistors DSST via the dummy string selection line DSSL, such that the dummy string selection transistors DSST function as pass transistors. A suitable pass voltage $V_{pass}$ may be applied to the other unselected string selection lines SSL2 and SSL3 and the wordlines WL1 to WLn. The pass voltage $V_{pass}$ may be applied to the ground source line GSL to turn on a ground select transistor GST.

In an embodiment, to perform the verification operation S30 of FIG. 3 on the selected memory layer L1, a voltage having a level substantially equal to the sensing voltage Va may be applied to common source lines CSL2 and CSL3 of the unselected memory layers L2 and L3, thereby preventing a current from flowing through the channel lines in the unselected memory layer L2 and L3. The common source line CSL1 of the selected memory layer L1 may be grounded.

In the operation S30, in the selected memory layer L1, a first plurality of string selection transistors that have been programmed to reach a target state (corresponding to a target threshold voltage) and a second plurality of string selection transistors that have not reached the target state may be determined. For example, in a subsequent process, an electric potential of a bitline coupled with a programmed string selection transistor may become 0 V, whereas an electric potential of a bitline coupled with an unprogrammed string selection transistor may become an operation voltage $V_{cc}$. As a result, a screening transistor may be programmed by using different electric potentials applied to the respective bitlines as will be described below.

FIG. 5A shows a distribution K of threshold values $V_{thr}$ of the string selection transistors coupled with the selected string selection line SSL1. A first portion of the distribution related to unprogrammed string selection transistors UPSST of FIG. 4C having a threshold value $V_{thr}$ smaller than the verification voltage $V_{vfy}$ may be shown in the left region A. A second portion of the distribution related to programmed string selection transistors PSST of FIG. 4C having a threshold value $V_{thr}$ greater than the verification voltage $V_{vfy}$ may be shown in the right region B.

The programmed string selection transistors PSST of FIG. 4C distributed in the right region B of FIG. 5A may be excluded in a next program loop using the ISPP technique as described above. Instead, the next program loop may be performed on the unprogrammed string selection transistors UPSST of FIG. 4C, such that a program voltage increased by a predetermined value $\Delta V_{ISPP}$ may be applied to the unprogrammed string selection transistors UPSST.

Figure 4D:
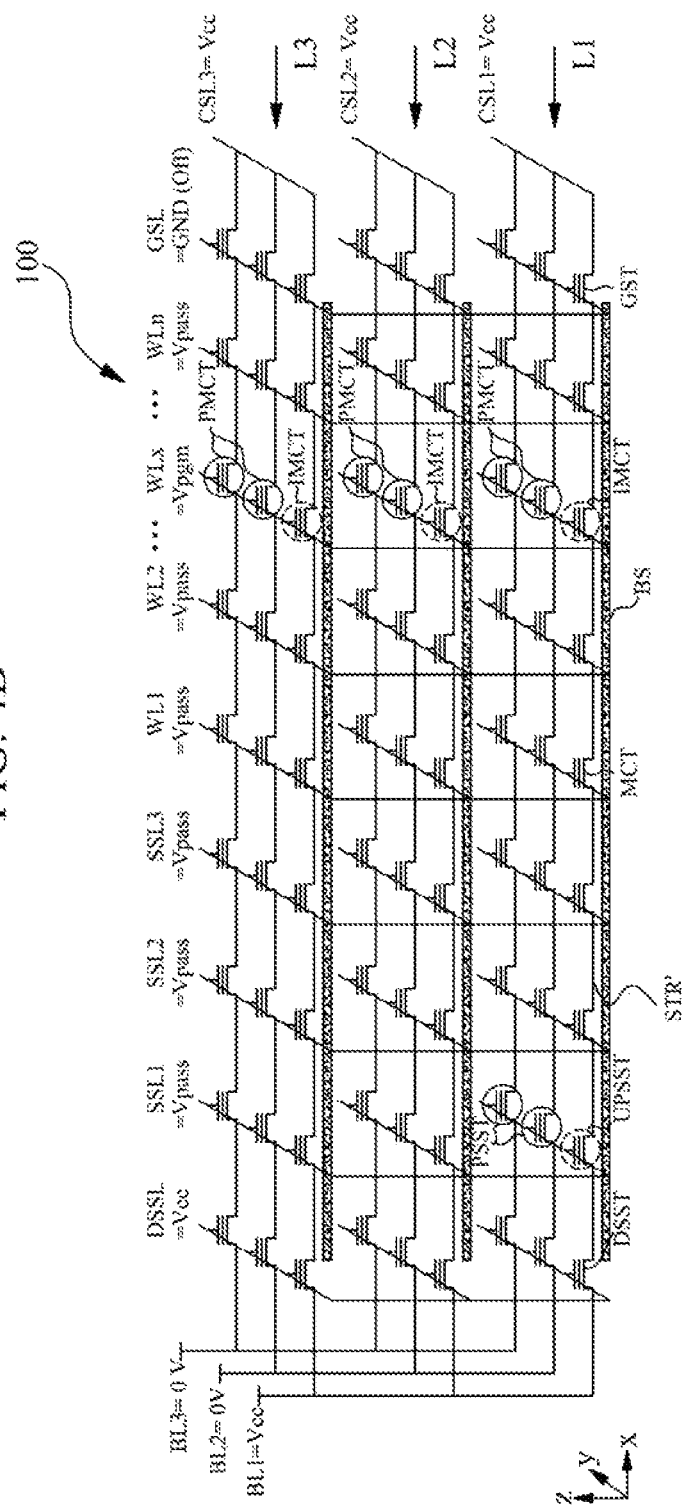

Referring to FIG. 4D, the unprogrammed string selection transistor UPSST, which has been determined as such by the operation S30 and is coupled with the string selection line SSL1, is indicated by a dotted line circle, whereas the programmed string selection transistors PSST are indicated by solid line circles. A ground voltage or a voltage higher than the ground voltage, e.g., a common collector voltage $V_{cc}$, may be applied to the common source lines CSL1, CSL2, and CSL3 of the memory layers L1, L2, and L3, a voltage equal to or higher than the common collector voltage $V_{cc}$ may be applied to the bitline BL1 coupled with the unprogrammed string selection transistor UPSST, and the common collector voltage $V_{cc}$ may be applied to the dummy string selection line DSSL, thereby inducing a channel potential boost for program inhibition at a memory string STR' coupled with the unprogrammed string selection transistor UPSST. The ground voltage may be applied to bitlines BL2 and BL3 coupled with the programmed string selection transistors PSST, and thus corresponding channel lines are grounded. The common ground line GSL may be grounded to turn off common ground transistors GST.

Next, a program voltage $V_{pgm}$ is applied to a wordline WLx selected from among the wordlines WL1 to WLn. The pass voltage $V_{pass}$ may be applied to the string selection lines SSL1, SSL2, and SSL3 and the other wordlines WL1 to $WL_{x-1}$ and $WL_{x+1}$ to WLn, such that the string selection transistors SST and the memory cells MCT coupled to the other wordlines WL1 to $WL_{x-1}$ and $WL_{x+1}$ to WLn function as pass transistors. At S40a of FIG. 3, memory cells PMCT of FIG. 4D coupled with memory strings, which include the programmed string selection transistors PSST and grounded channel lines, may be selectively programmed by a program voltage $V_{pgm}$ to have a predetermined threshold value. In a next program loop, the programmed memory cells PMCT may function as screening switches (or screening transistors) to exclude the already programmed string selection transistors PSST from the next program loop. In this regard, the threshold value of the programmed memory cells PMCT may be any value suitable for the programmed memory cells PMCT to function as ON/OFF switches. In the present disclosure, the operation for programming the memory cells PMCT is referred to as an operation for programming screening transistors.

In contrast, at S40b of FIG. 3, the common collector voltage $V_{cc}$ is applied to the string STR', and thus a dummy string selection transistor DSST coupled to the string STR' is turned off, and a corresponding channel line becomes floated. An electric potential of the channel line of the memory string STR', which is capacitively coupled with a gate voltage applied to the wordline WLx, may be automatically boosted by a boosting voltage $V_{boosting}$ in a range from about 7 V to about 10 V from a level corresponding to a difference $V_{cc}-V_{th}$ between the common collector voltage $V_{cc}$ and a threshold voltage $V_{th}$ of a string selection transistor, and thus programming of one or more of memory cells IMCT coupled to the string STR' may be inhibited at S40b of FIG. 3. A hatched region BS indicates that a corresponding channel line has a boosted electric potential. Each of the memory cells IMCT indicated by a dotted line circle corresponds to a program-inhibited memory cell.

FIG. 4D shows an example that the memory cell transistors PMCT coupled with the wordline WLx are used as screening transistors. Here, since a memory cell transistor may be used as a screening transistor, a degree of integration of a 3D non-volatile memory device 100 may be increased compared to a non-volatile memory device including additional dummy transistors that function as the screening transistors.

According to an embodiment, a wordline of a screening transistor may be an uppermost wordline WLn adjacent to the common ground line GSL among the wordlines WL. In an embodiment, a memory cell transistor coupled with the uppermost wordline WLn is used as a screening transistor.

Figure 4E:
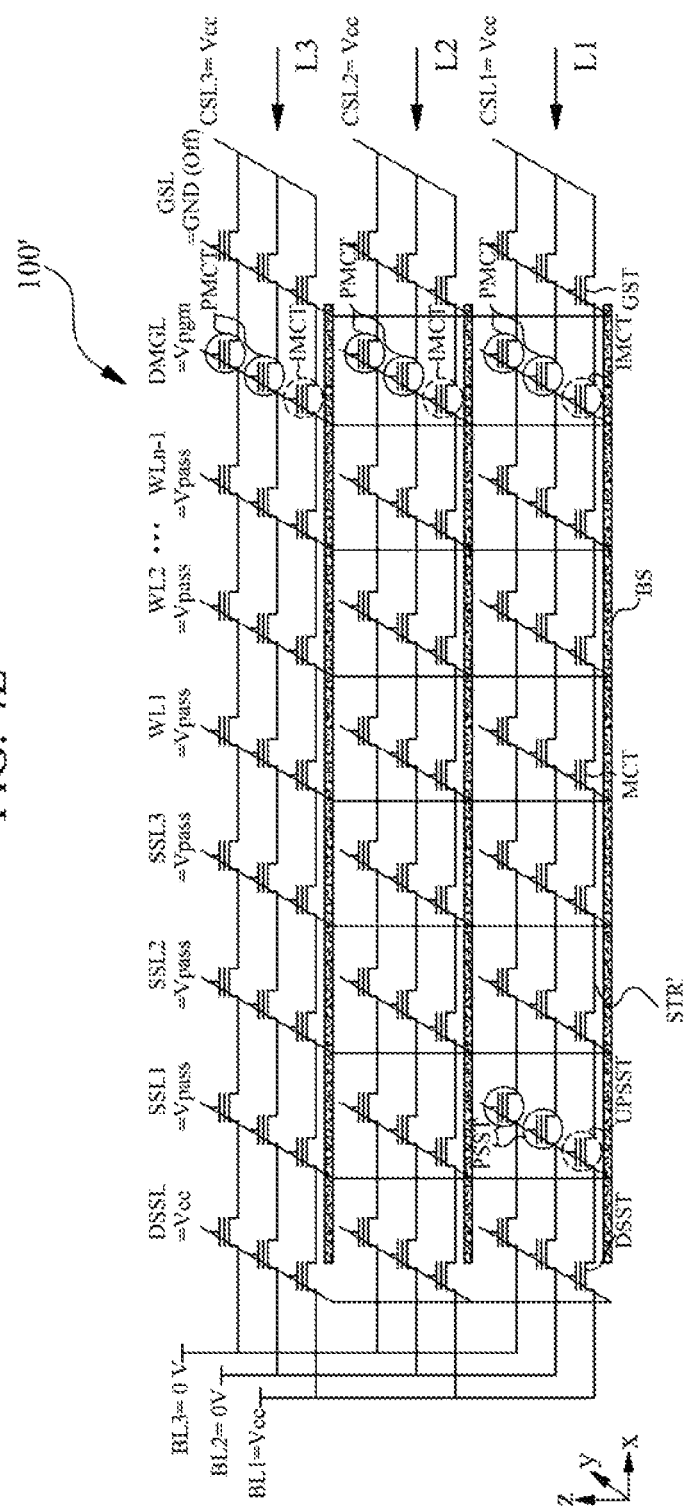
Figure 4F:
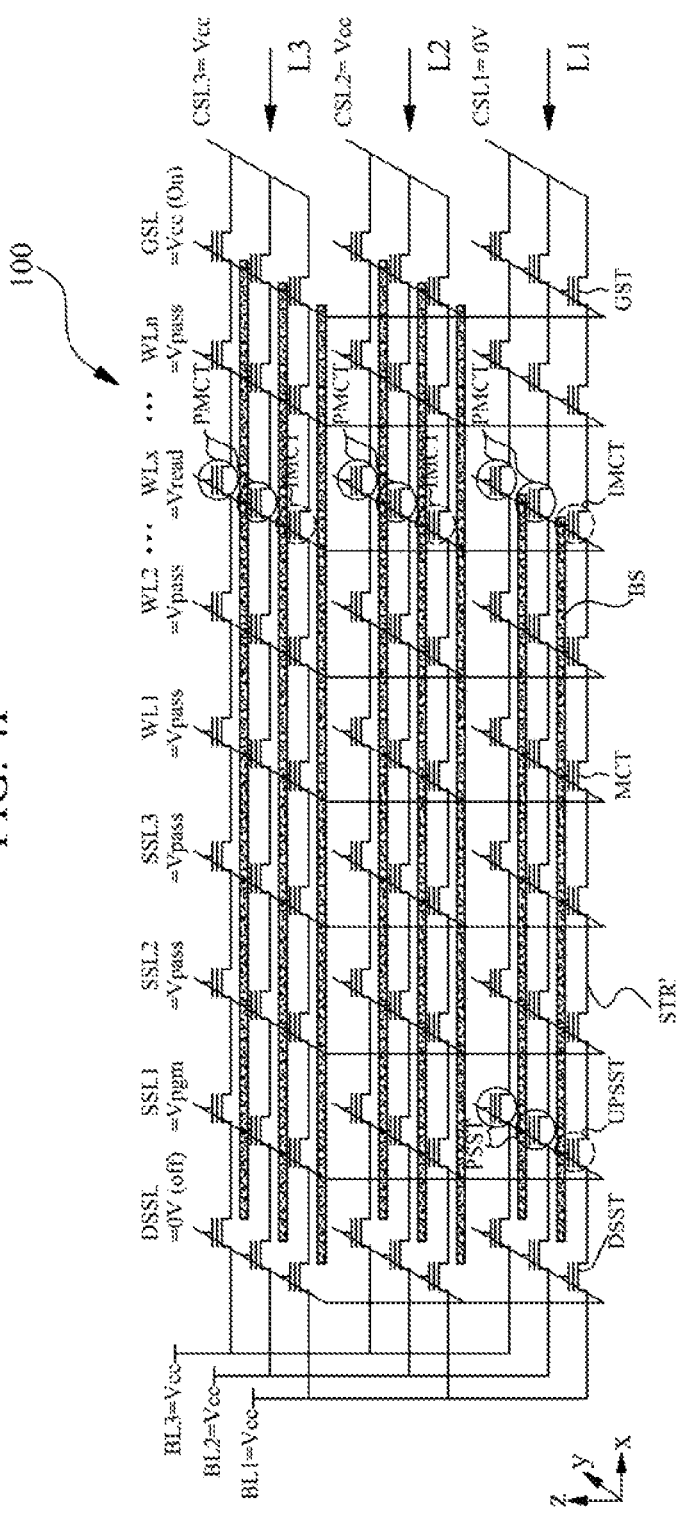

In another embodiment also shown in FIG. 4E, a 3D non-volatile memory device 100' may include a plurality of wordlines WL1 to WLn−1 and a dummy ground line DMGL disposed between an uppermost wordline WLn−1 and a common ground line GSL, and utilize a dummy transistor coupled with the dummy ground line DMGL as the screening transistor. In this case, the dummy transistor may be programmed by applying a program voltage $V_{pgm}$ to the dummy ground line DMGL.

Referring to FIG. 5B, waveforms of signals for selectively programming one or more of screening transistors of a 3D non-volatile memory device are illustrated. The reference character BL1 denotes a bitline to which a common source voltage Vcc is applied for program inhibition, and the reference characters BL2 and BL3 denote bitlines to which a ground voltage GROUND is applied for programming the one or more screening transistors. In the embodiment shown in FIG. 5B, transistors coupled with a wordline WLx may be programmed to function as screening transistors. However, embodiments of the present disclosure are not limited thereto. As described above, transistors that are coupled with a dummy ground line (e.g., the dummy ground line DMGL of FIG. 4E), instead of the wordline WLx, may be programmed to function as screening transistors. In this case, a program voltage $V_{pgm}$ may be applied to the dummy ground line DMGL, thereby programming the screening transistors.

Next, referring back to FIG. 4F, to select the first memory layer L1 including the unprogrammed string selection transistors UPSST, the common source line CSL1 of the selected memory layer L1 is grounded, a common collector voltage $V_{cc}$ is applied to other common source lines CSL2 and CSL3 of the unselected memory layers L2 and L3, a power voltage (e.g., the common collector voltage $V_{cc}$) is applied to the common ground line GSL, and the common collector voltage $V_{cc}$, for example, is applied to the bitlines BL1, BL2, and BL3, thereby electrically floating memory strings of the unselected memory layers L2 and L3.

Next, a voltage (e.g., a read-out voltage $V_{read}$ or the common collector voltage $V_{cc}$) smaller than a threshold voltage $V_{th}$ of a programmed memory cell transistor PMCT (that is, a screening transistor), is applied to the wordline WLx, thereby turning the programmed memory cell transistors PMCT off and turning unprogrammed screening transistors IMCT on. Here, at S50 of FIG. 3, when a program voltage $V_{pgm}$, e.g., a program pulse increased by $\Delta V_{ISPP}$ using the ISPP technique, is applied to the string selection line SSL1, channel lines of memory strings STR' coupled with the unprogrammed string selection transistors UPSST are grounded, and thus the unprogrammed string selection transistors UPSST are programmed to a target value.

On the other hand, the programmed memory cell transistors PMCT are turned off and channel lines of corresponding memory strings other than the memory string STR' are electrically floated. Thus, electrical potentials at these channel lines are boosted, and the programmed string selection transistors PSST are program-inhibited. Furthermore, memory strings of the unselected memory layers L2 and L3 are program-inhibited due to the common collector voltage $V_{cc}$ applied to the common ground lines CSL2 and CSL3, regardless of whether memory cells coupled with the wordline WLx are turned on or off.

Waveforms of signals shown in FIG. 5C may correspond to the above-described bias states. Any bias voltage may be applied to the bitlines BL1, BL2, and BL3. As described above, if the dummy ground line DMGL (e.g., the dummy ground line DMGL of FIG. 4E) is provided, the common collector voltage $V_{cc}$ may be applied to the dummy ground line DMGL. Therefore, as shown in FIG. 4E, the programmed string selection transistors PSST of the selected memory layer L1 may be program-inhibited due to the bias voltages applied to the common source lines CSL1, CSL2, and CSL3.

Referring back to FIG. 3, according the above-described embodiments, the programming operation S20, the verification operation S30, the operations S40a and S40b for selectively programming memory cells to make the programmed memory cells function as screening memory cells, and the operation S50 for programming unprogrammed string selection transistors by using the screening memory cells, are performed on string selection transistors coupled with the selected string selection line (or a first string selection line) SSL1 of the selected memory layer (or a first memory layer) L1 using the ISPP technique. Thus, initialization of the string selection transistors coupled with the selected string selection line SSL1 and included in the selected memory layer L1 may be completed. As described above, when initialization of string selection transistors coupled with the selected string selection line SSL1 of the selected memory layer L1 is completed, string selection transistors coupled with a second string selection line SSL2 adjacent to the first string selection line SSL1 may be sequentially performed. When initialization of all of the string selection transistors included in the selected memory layer L1 is completed, an initialization process is performed on string selection transistors included in a second memory layer L2 adjacent to the first memory layer L1. In this manner, all of string selection transistors of the 3D non-volatile memory device 100 may be initialized.

In the above-described embodiment, like memory cells constituting a page, string selection transistors arranged in a second direction (e.g., the y-axis direction of FIG. 4F) have the same program state corresponding to a target value (or a target threshold voltage) in the same program cycle, but embodiments of the present disclosure are not limited thereto. For example, in a single program cycle, a plurality of string selection transistors may be programmed to have different states, for example, a first program state, a second program state, and a third program state. Furthermore, according to another embodiment, having single level select transistors having an interleaved architecture, even-numbered cells and odd-numbered cells may constitute two pages different from each other. In an embodiment having multi-level transistors, since each transistor stores one least significant bit (LSB) and one most significant bit (MSB) like a memory cell, the MLC transistor has four pages. For example, in such an embodiment, MSB pages and LSB pages may be provided on even-numbered bitlines and odd-numbered bitlines, respectively.

As described above, when threshold voltages of the string selection transistors of the memory layers L1, L2, and L3 are set to target values, a particular memory layer may be selected without a disturbance of the other layers, and a program operation, a read operation, or an erase operation may be performed to address a memory cell of the selected memory layer using a method identical to or similar to a 2D memory cell addressing method in the related art.

Figure 6A:
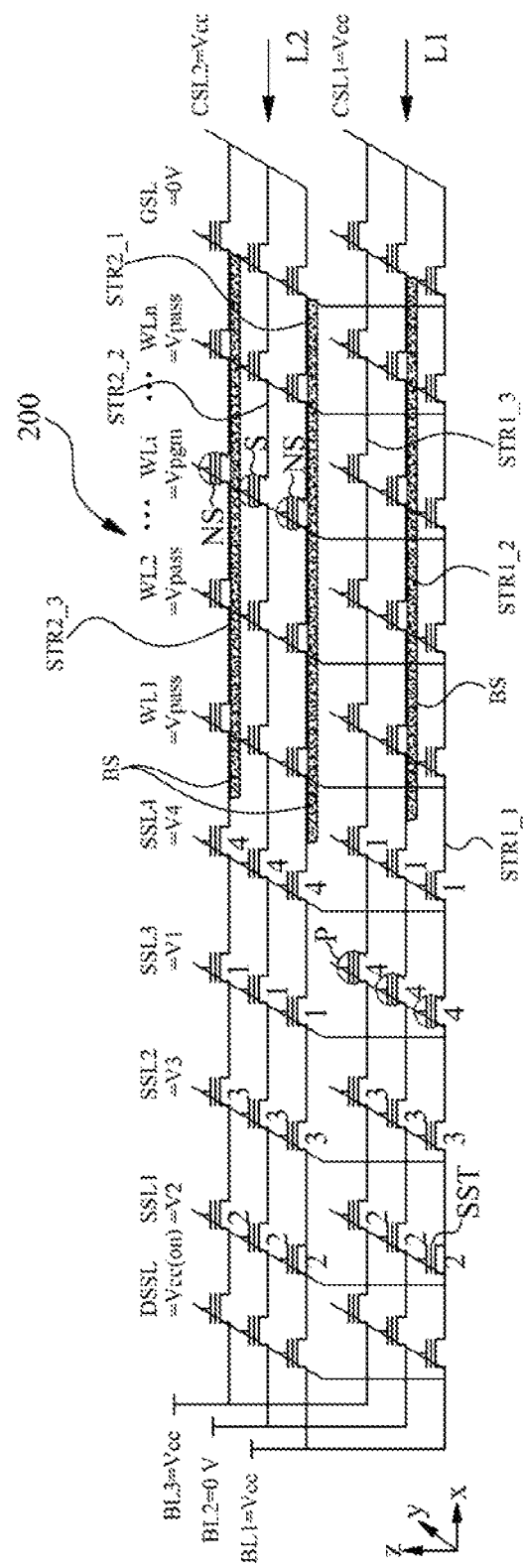
FIG. 6A is a circuit diagram illustrating a process for programming a selected memory cell of a 3D non-volatile memory device that is initialized by a process of initializing string selection transistors according to an embodiment of the present disclosure.
Figure 6B:
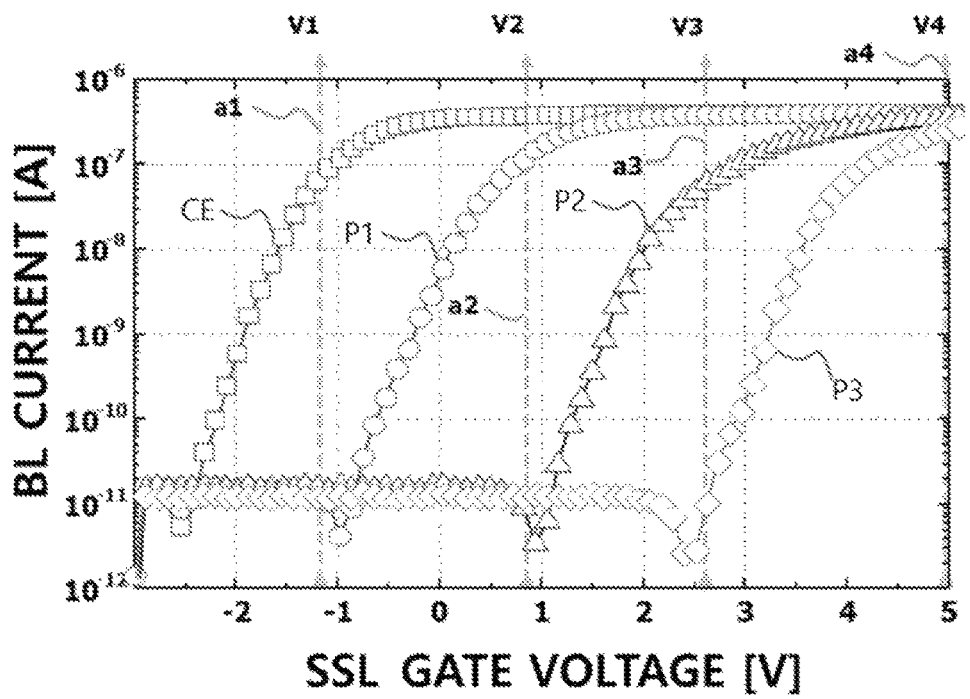
FIG. 6B is a graph showing measured transfer characteristics of string selection transistors initialized to multi levels according to an embodiment of the present disclosure.
Figure 6C:
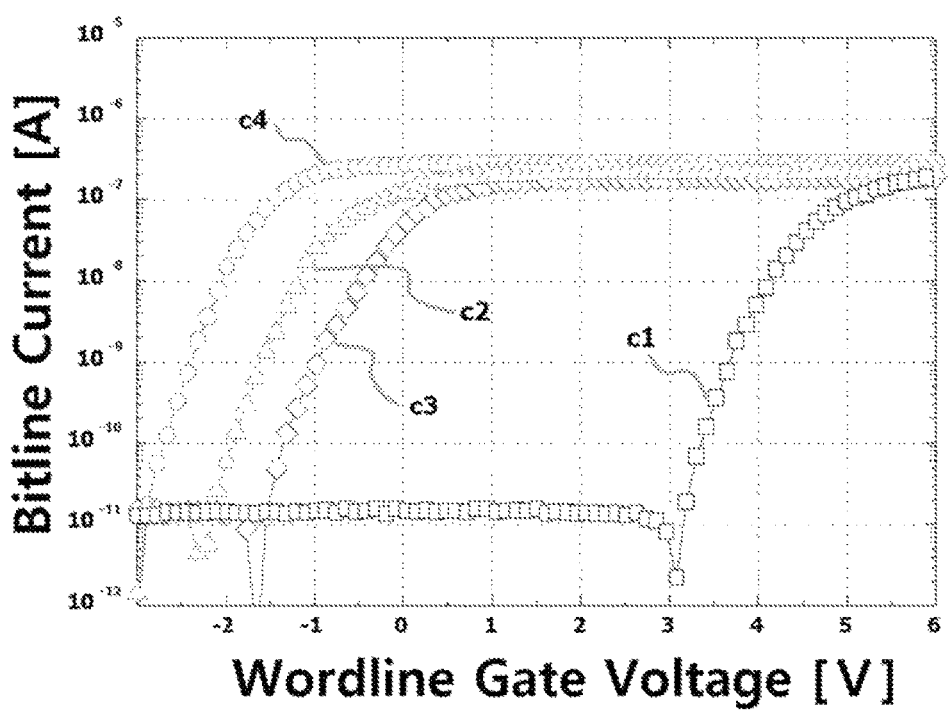
FIG. 6C is a graph showing measured transfer characteristics of a programmed memory cell and an unselected and inhibited memory cell in the selected memory layer, and an unselected and inhibited memory cell and erased memory cell in an unselected memory layer.

FIG. 6A is a circuit diagram for illustrating a method of programming a selected memory cell of a 3D non-volatile memory device 200 that is initialized by a method of initializing string selection transistors according to an embodiment of the present disclosure, FIG. 6B is a graph showing measured transfer characteristics of string selection transistors SST initialized to multi levels according to an embodiment of the present disclosure, and FIG. 6C is a graph showing measured transfer characteristics of a programmed memory cell C1, an unselected and inhibited memory cell C2 in the selected memory layer, and an unselected and inhibited memory cells C3, and an erased memory cell C4 in an unselected memory layer.

Selection of one of first and second memory layers L1 and L2 of the non-volatile memory device 200 according to an embodiment of the present disclosure is based on a layer selection by multi-level operation (LSM) scheme, such that a memory layer in which all of string selection transistors are turned on is selected, and a memory layer in which even one of string selection transistors is turned off is unselected. Referring to FIG. 6A, numbers 1, 2, 3, and 4 allocated to each of the string selection transistors SST indicate states corresponding to respective threshold value levels of the string selection transistors SST. For example, the states of the string selection transistors SST indicated by the numbers 1, 2, 3, and 4 may respectively correspond to −1 V, 1 V, 3 V, and 5 V, which are exemplary threshold values $V_{th}$ as shown in Table 1 below. Voltages V2, V3, V1, and V4 shown in FIG. 6B respectively allocated to the string selection lines SSL1, SSL2, SSL3, and SSL4 of FIG. 6A, indicate values of voltages applied to the respective string selection lines SSL1, SSL2, SSL3, and SSL4 for selecting a memory layer L2. The Curves CE, P1, P2 and P3 of the measured transfer characteristics of string select transistors SST correspond to states 1, 2, 3 and 4, respectively. Table 1 exemplifies a case where the voltages V2, V3, V1, and V4 are respectively applied to the string selection lines SSL1, SSL2, SSL3, and SSL4. Here, the values of the voltages V1, V2, V3, and V4 are indicated by arrows a1, a2, a3, and a4 shown in FIG. 6B, respectively.

TABLE 1

| SST State | $V_{th}$ of SST | SSL1 | SSL2 | SSL3 | SSL4 |
|---|---|---|---|---|---|
| 1 | −1 V | V 2 | V 3 | V 1 | V 4 |
| 2 | 1 V | V 2 | V 3 | V 1 | V 4 |
| 3 | 3 V | V 2 | V 3 | V 1 | V 4 |
| 4 | 5 V | V 2 | V 3 | V 1 | V 4 |

Referring back to FIG. 6A, as shown in Table 1, when the states (of respective string selection transistors SST are set and corresponding voltages are respectively applied to the string selection transistors SST, a plurality of string selection transistors each indicated by a dotted line P among the string selection transistors SST are turned off, and the other string selection transistors are turned on. Because the turned off string selection transistors are disposed in the first memory layer L1, the second memory layer L2 may be selected by a bias combination of the string selection lines SSL1, SSL2, SSL3 and SSL4.

Although the above-described embodiment includes four string selection lines SSL1, SSL2, SSL3, and SSL4, it may be preferable for down-scaling the non-volatile memory device 200 such that the number of string selection lines may be reduced. As another approach, it is also preferable that each of the string selection transistors has two or more multi-level threshold values, so that a layer may be selected based on the LSM scheme.

In one embodiment, string selection transistors arranged in the y-axis direction and stacked in the z-axis direction (or in an y-z plane) to share select lines may be initialized, such that threshold values of the string selection transistors gradually increase or decrease in the z-axis direction. In such an embodiment, if a number of string selection lines is r, a number of vertically-stacked memory layers may be $2^r$ when the r is an even number or may be $2^{r-1}$ when the r is an odd number. Table 2 below shows values of bias voltages to be applied to respective string selection lines for selecting each memory layer with 4 string selection lines, in a case that a 3D stacked non-volatile memory device according to an embodiment includes 16 memory layers and 4 string selection lines. The number of string selection transistors for selecting memory layers may be exponentially reduced in combination with the LSM scheme, and string selection transistors having multi-level states may be initialized with a single signal.

TABLE 2

| | Threshold Value | | | | SSL Bias | | | |
|---|---|---|---|---|---|---|---|---|
| Memory Layer | 1st SST | 2nd SST | 3rd SST | 4th SST | 1st SSL | 2nd SSL | 3rd SSL | 4th SSL |
| 1st Layer | 3 V | −1 V | 3 V | −1 V | 3.5 V | 0 V | 3.5 V | 0 V |
| 2nd Layer | 3 V | −1 V | 2 V | 1 V | 3.5 V | 0 V | 2.5 V | 1.5 V |
| 3rd Layer | 3 V | −1 V | 1 V | 2 V | 3.5 V | 0 V | 1.5 V | 2.5 V |
| 4th Layer | 3 V | −1 V | −1 V | 3 V | 3.5 V | 0 V | 0 V | 3.5 V |
| 5th Layer | 2 V | 1 V | 3 V | −1 V | 2.5 V | 1.5 V | 3.5 V | 0 V |
| 6th Layer | 2 V | 1 V | 2 V | 1 V | 2.5 V | 1.5 V | 2.5 V | 1.5 V |
| 7th Layer | 2 V | 1 V | 1 V | 2 V | 2.5 V | 1.5 V | 1.5 V | 2.5 V |
| 8th Layer | 2 V | 1 V | −1 V | 3 V | 2.5 V | 1.5 V | 0 V | 3.5 V |
| 9th Layer | 1 V | 2 V | 3 V | −1 V | 1.5 V | 2.5 V | 3.5 V | 0 V |
| 10th Layer | 1 V | 2 V | 2 V | 1 V | 1.5 V | 2.5 V | 2.5 V | 1.5 V |
| 11th Layer | 1 V | 2 V | 1 V | 2 V | 1.5 V | 2.5 V | 1.5 V | 2.5 V |
| 12th Layer | 1 V | 2 V | −1 V | 3 V | 1.5 V | 2.5 V | 0 V | 3.5 V |
| 13th Layer | −1 V | 3 V | 3 V | −1 V | 0 V | 3.5 V | 3.5 V | 0 V |
| 14th Layer | −1 V | 3 V | 2 V | 1 V | 0 V | 3.5 V | 2.5 V | 1.5 V |
| 15th Layer | −1 V | 3 V | 1 V | 2 V | 0 V | 3.5 V | 1.5 V | 2.5 V |
| 16th Layer | −1 V | 3 V | −1 V | 3 V | 0 V | 3.5 V | 0 V | 3.5 V |

According to an embodiment of the present disclosure, since memory cells in a y-z plane are arranged in a matrix-like shape, the memory cells coupled with a wordline WLi selected for programming a selected memory cell S may be biased with a high programming voltage $V_{pgm}$. In this case, while the selected memory cell S is being programmed, an unwanted programming operation or an unwanted programming disturbance may occur at unselected memory cells NS. Therefore, it is desirable for the programming operation on the selected memory cell S to have bit selectivity. According to an embodiment, a program voltage, e.g., 0 V, may be applied to a second bitline BL2 connected to a memory string STR2_2 including the memory cell S to be programmed, whereas a high common collector voltage Vcc, e.g., about 2.3 V, may be applied to first and third bitlines BL1 and BL3 that are respectively connected to the other strings STR2_1 and STR2_3. At least one or more string selection transistors of the other strings STR2_1 and STR2_3 are turned off by the common collector voltage $V_{cc}$, and thus the unselected strings STR2_1 and STR2_3 may be biased to a high channel potential, e.g., 8 V, reducing a voltage drop via a tunnelling insulation layer of a memory cell in the unselected memory strings STR2_1 and STR2_3. As a result, a self-boosted program inhibition (SBPI) scheme (or SBPI mode) for preventing electrons from tunnelling from a channel to a data storage layer may be performed.

Another SBPI mode in which a program operation has bit selectivity may be applied. To this end, each of memory strings may include not only string selection transistors SST, but also a dummy selection transistor, where a common collector voltage Vcc may be applied to a dummy string selection line DSSL coupled with the dummy select transistor and the bitlines BL1 and BL3 of the unselected strings STR2_1 and STR2_3. As a result, the dummy select transistor may be turned off, channels of the unselected strings STR2_1 and STR2_3 may become floated, and channel potentials of the unselected memory cells NS sharing the wordline WLi may be boosted. As a result, a programming operation on the memory cells NS may be inhibited. A hatched region indicated by the reference character BS denotes a channel with a boosted potential.

Although a pass voltage $V_{pass}$ is applied to the remaining wordlines WL1 to WLi−1 and WLi+1 to WLn coupled with the unselected memory cells in the embodiment shown in FIG. 6A, embodiments of the present disclosure are not limited thereto. For example, a program voltage $V_{pgm}$ may be applied to the wordline WLi of the selected memory cell S, two wordlines WLi−1 and WLi+1 respectively coupled with two unselected memory cells adjacent to the selected memory cell S in the same string may be grounded, and the pass voltage $V_{pass}$ may be applied to the remaining wordlines coupled with the other unselected memory cells.

According to another embodiment, during a program operation, to suppress a program disturbance like a soft erase, a pass disturbance, or an edge disturbance, the program operation may be performed according to a local SBPI scheme or an asymmetric SBPI scheme.

FIG. 6B shows measured transfer characteristics of string selection transistors initialized according to an embodiment of the present disclosure. FIG. 6C shows that transfer characteristics of the string selection transistors, after all of the string selection transistors have been erased as indicated by a fourth curve C4. Specifically, FIG. 6C shows a first curve C1 of a selected memory string of a selected memory layer that is programmed, a second curve C2 of an unselected memory string of the selected memory layer, and a third curve C3 of the other memory strings of an unselected memory layer that are are program-inhibited, and thus a reliable program operation suppressing the program disturbance may be performed.

The program operation may be performed by using the ISPP technique for controlling a threshold value Vth programmed based on a bit-by-bit program-verification algorithm as described above. Furthermore, although the above-described embodiments have been described in relation to program operations, a memory layer may also be selected according to an LSM scheme according to an embodiment of the present disclosure for a read operation and/or an erase operation. The read operation or the erase operation may be performed by applying a read-out voltage $V_{read}$ (e.g., 0 V) or an erase voltage $V_{ers}$ (e.g., a negative voltage or a ground voltage) to a selected wordline in a selected memory layer and applying a pass voltage $V_{pass}$ (e.g., from 4V to 5V) to unselected wordlines in the selected memory layer.

Figure 7:
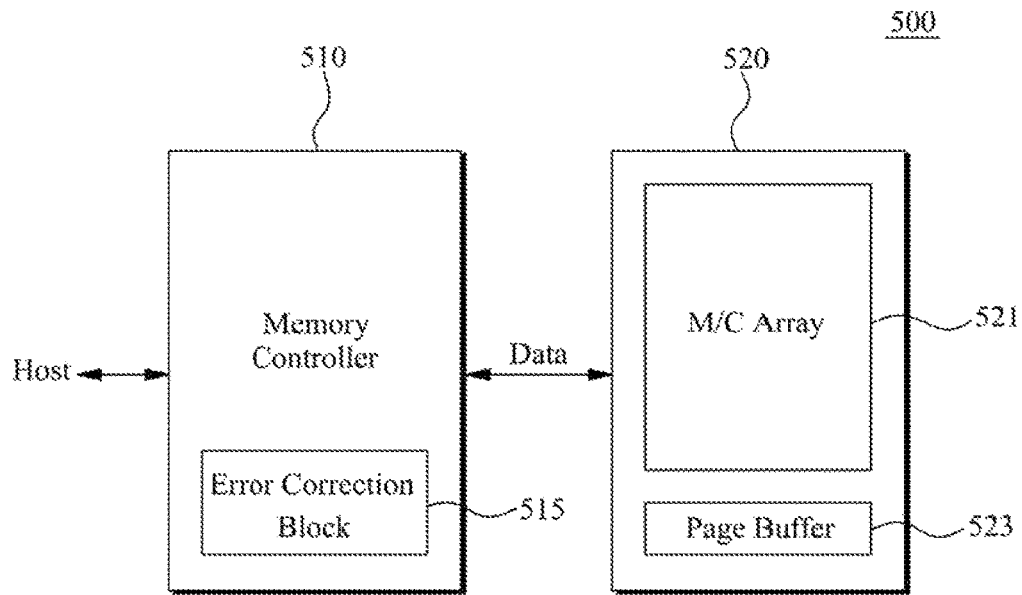
FIG. 7 is a block diagram showing a memory system according to an embodiment of the present disclosure.

FIG. 7 is a block diagram showing a memory system 500 according to an embodiment.

Referring to FIG. 7, the memory system 500 includes a memory controller 510 and a non-volatile memory device 520. The memory controller 510 may perform error correcting codes with respect to the non-volatile memory device 520. The memory controller 510 may control the non-volatile memory device 520 based on commands and addresses from an external circuit.

The memory controller 510 may perform an error correcting encoding process on a data requested to write, when the memory controller 510 receives a write request from a host. Furthermore, the memory controller 510 may control the non-volatile memory device 520 to program the encoded data at a memory region corresponding to a provided address. Furthermore, during a read operation, the memory controller 510 may perform an error correcting decoding process on a data output from the non-volatile memory device 520. Errors included in output data may be corrected by the error correcting decoding process. To detect and correct the errors, the memory controller 510 may include an error correcting block 515.

The non-volatile memory device 520 may include a memory cell array 521 and a page buffer 523. The memory cell array 521 may include an array of single-level memory cells or 2 or higher bit multi-level memory cells. When the memory controller 510 receives an initialization request, the memory controller 510 may initialize string selection transistors of respective memory layers to have a predetermined state (threshold voltage) by using a programming technique or an erasing technique.

Figure 8:
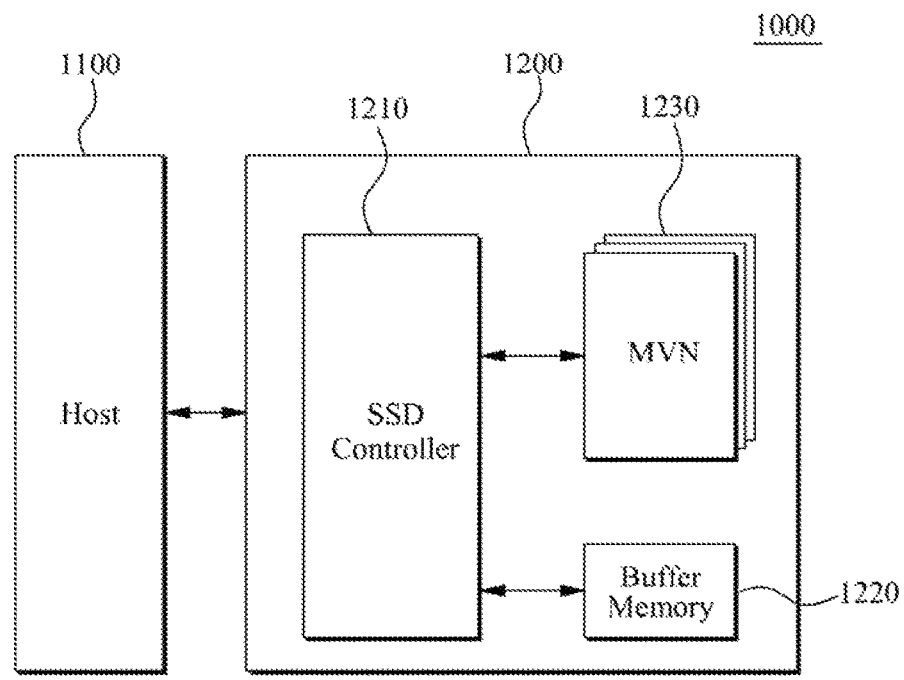
FIG. 8 is a block diagram showing a storage device including a solid state disk (SSD) according to an embodiment of the present disclosure.

FIG. 8 is a block diagram showing a storage device 1000 including a SSD according to an embodiment.

Referring to FIG. 8, the storage device 1000 includes a host 1100 and a SSD 1200. The SSD 1200 may include a SSD controller 1210, a buffer memory 1220, and a non-volatile memory device 1230. The SSD controller 1210 provides electric and physical connections between the host 1100 and the SSD 1200. In an embodiment, the SSD controller 1210 provides an interface between the host 1100 and the SSD 1200 in correspondence to a bus format of the host 1100. Furthermore, the SSD controller 1210 may decode commands provided by the host 1100 and access the non-volatile memory device 1230 based on a result of the decoding. Unlimited examples of the bus format of the host 1100 may include USB (Universal Serial Bus), SCSI (Small Computer System Interface), PCI express, ATA (Advanced Technology Attachment), PATA (Parallel ATA), SATA (Serial ATA), and SAS (Serial Attached SCSI).

A data to be written provided by the host 1100 or a data read out from the non-volatile memory device 1230 may be temporarily stored in the buffer memory 1220. When the host 1100 sends a read request and data existing in the non-volatile memory device 1230 is cached, the buffer memory 1220 may provide a cache function for providing cached data directly to the host 1100. Generally, data transmission rate based on a bus format (e.g., SATA or SAS) of the host 1100 may be faster than data transmission speed of memory channels of the SSD 1200. In this case, the large-capacity buffer memory 1220 may be provided to minimize performance deterioration due to the speed difference. The buffer memory 1220 therefor may be a synchronous DRAM for providing sufficient buffering performance. However, embodiments of the present disclosure are not limited thereto.

The non-volatile memory device 1230 may be provided as a storage medium of the SSD 1200. For example, the non-volatile memory device 1230 may be a NAND-type flash memory with large storage capacity. For another example, a NOR-type flash memory, a phase-change memory, a magnetic memory, a resistive memory, a ferro-dielectric memory, or a memory system including a combination thereof may be applied as the non-volatile memory device 1230.

Figure 9:
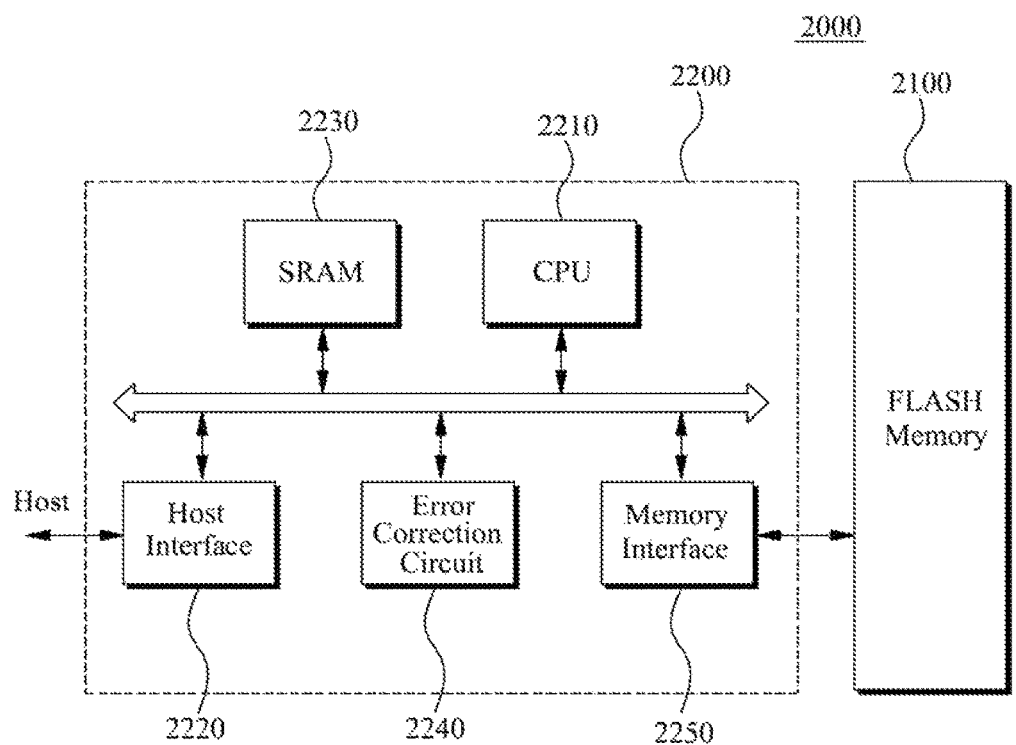
FIG. 9 is a block diagram showing a memory system according to an embodiment of the present disclosure.

FIG. 9 is a block diagram showing a memory system 2000 according to another embodiment of the present disclosure.

Referring to FIG. 9, the memory system 2000 may include a memory controller 2200 and a flash memory device 2100. The flash memory device 2100 may include the non-volatile memory devices 100 and 200 as described above with reference to FIGS. 1 through 7. The flash memory device 2100 may detect memory cells with abnormal speeds during verification of target states, and thus the flash memory device 2100 may show reliable program performance.

The memory controller 2200 may be configured to control the flash memory device 2100. An SRAM 2230 may be used as an operation memory for the CPU 2210. A host interface 2220 may embody a data exchange protocol for the host to be connected to the memory system 2000. An error correcting circuit 2240 equipped in the memory controller 2200 may detect and correct errors included in data read out from the flash memory device 2100. A memory interface 2250 may perform interfacing with the flash memory device 2100. A CPU 2210 may perform overall control operations for data exchange of the memory controller 2200. The memory system 2000 in accordance with the present disclosure may further include a ROM (not shown) that stores code data for interfacing with a host.

The flash memory device 2100 may be configured to communicate with an external circuit (e.g., a host) via one of various interface protocols, such as USB, MMC, PCI-E, SAS, SATA, PATA, SCSI, ESDI, or IDE. The memory system 2000 in accordance with the present disclosure may be applied to various user devices, such as a ultra mobile PC (UMPC), a workstation, a net-book, a personal digital assistant (PDA), a portable computer, a web tablet, a wireless phone, a mobile phone, a smart phone, a digital camera, a digital audio recorder, a digital audio player, a digital picture recorder, a digital picture player, a digital video recorder, a digital video player, a device capable of transmitting and receiving data wirelessly, or a home network.

Figure 10:
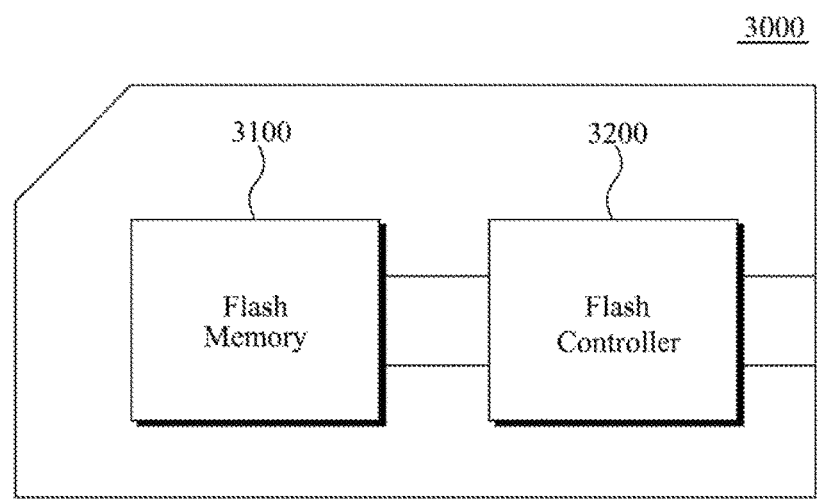
FIG. 10 is a block diagram showing a data storage device according to an embodiment of the present disclosure.

FIG. 10 is a block diagram showing a data storage device 3000 according to another embodiment of the present disclosure.

Referring to FIG. 10, the data storage device 3000 may include a flash memory 3100 and a flash controller 3200. The flash controller 3200 may control the flash memory 3100 based on control signals received from an external circuit connected to the data storage device 3000. A 3D memory array structure of the flash memory 3100 may be a channel stacked structure, a straight-shaped bit cost scalable structure, or a pipe-shaped BiCs structure. However, the above-stated structures are merely examples, and embodiments of the present disclosure are not limited thereto.

The data storage device 3000 in accordance with the present disclosure may constitute a memory card device, a SSD device, a multimedia card device, a SD card, a memory stick device, a hard disk drive device, a hybrid drive device, or a USB flash device. For example, the data storage device 3000 in accordance with an embodiment of the present disclosure may be a memory card that satisfies a standard or a specification to be generally used in an electronic device, such as a digital camera or a personal computer.

Figure 11:
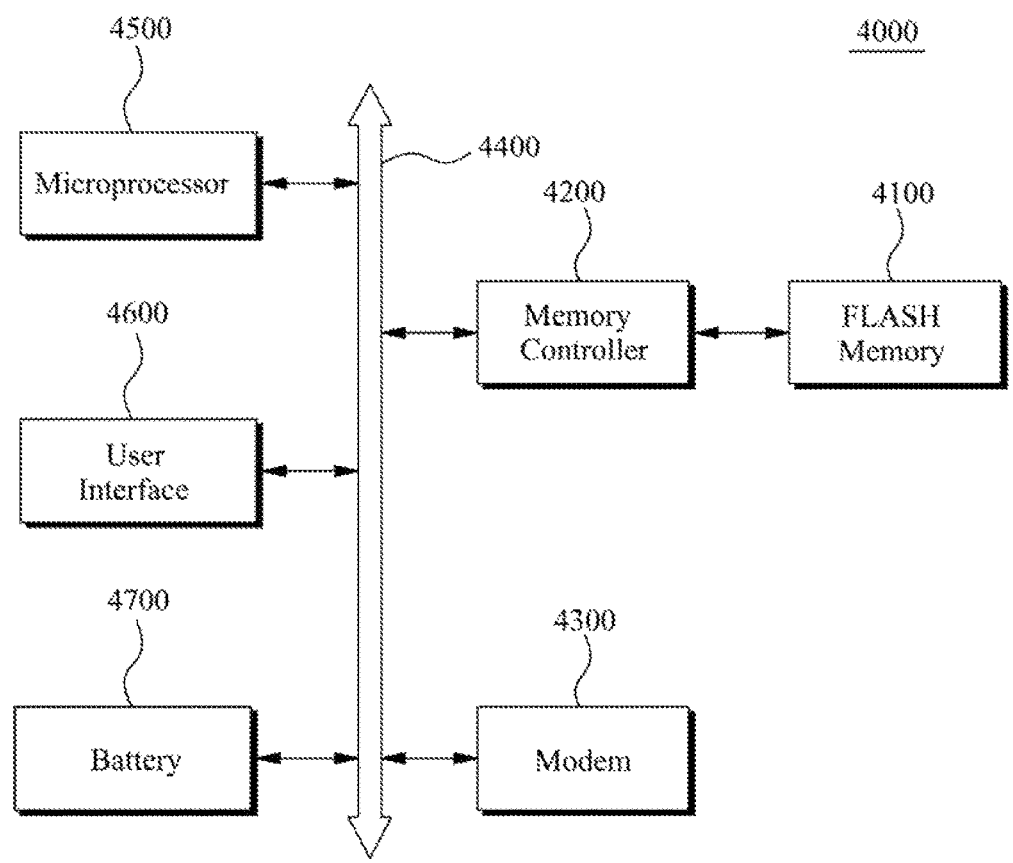
FIG. 11 is a block diagram showing a flash memory device and a computing system including the same, according to an embodiment of the present disclosure.

FIG. 11 is a block diagram showing a flash memory device 4100 and a computing system 4000 including the flash memory device 4100 according to an embodiment of the present disclosure.

Referring to FIG. 11, the computing system 4000 in accordance with the present disclosure may include the flash memory device 4100, a memory controller 4200, a modem 4300, such as a baseband chipset, a microprocessor 4500, and a user interface 4600 that are electrically connected to a bus 4400.

The flash memory device 4100 shown in FIG. 11 may be a non-volatile memory device as described above. The computing system 4000 in accordance with the present disclosure may be a mobile device. In this case, the computing system 4000 may further include a battery 4700 for supplying a power for operating the computing system 4000. Although not shown, the computing system 4000 in accordance with the present disclosure may further include an application chipset, a camera image processor (CIS), or a mobile DRAM. The memory controller 4200 and the flash memory device 4100 may constitute a SSD using a non-volatile memory device for storing data.

A non-volatile memory device and/or a memory controller in accordance with the present disclosure may be mounted via various types of packages. For example, a non-volatile memory device and/or a memory controller may be mounted via any of various packages including PoP (Package on Package), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), System In Package (SIP), Multi Chip Package (MCP), Wafer-level Fabricated Package (WFP), or Wafer-Level Processed Stack Package (WSP).

According to an embodiment of the present disclosure, a method of initializing a 3D non-volatile memory device for initializing string selection transistors for selecting a memory layer without a complicated peripheral circuit may be provided by securing bit selectivity based on the selection of a memory layer among a plurality of memory layers constituting the 3D non-volatile memory device and the selection of memory strings within the same memory layer. Furthermore, the string selection transistors may be programmed by using the ISPP technique, and thus a width of a distribution of threshold values of the string selection transistors may be reduced to secure a sharp distribution of the threshold values of the string selection transistors. Therefore, the string selection transistors may be reliably initialized.

Furthermore, according to another embodiment of the present disclosure, a method of reliably programming a 3D non-volatile memory device for programming selected memory cells without a disturbance between the selected memory cell and unselected memory cells by using initialized string selection transistors may be provided.

While embodiments of the present disclosure have been particularly shown and described, it will be understood by those of ordinary skill in the art that various changes in form and details may be made therein without departing from the spirit and scope of the present disclosure as defined by the following claims.

What is claimed is:

1. A method of initializing a 3D non-volatile memory device, the 3D non-volatile memory device comprising a plurality of string selection lines, a plurality of wordlines, a dummy ground line, a ground selection line, and a plurality of memory layers, each of the memory layers comprising a plurality of channel lines respectively coupled to a plurality of bitlines via first ends of the plurality of channel lines and coupled to a common source line of the memory layer via second ends of the plurality of channel lines, wherein the plurality of string selection lines, the plurality of wordlines, the dummy ground line and the ground selection line intersect with the plurality of channel lines, and each of the plurality of channel lines defines a memory string, the method comprising, applying a first program voltage to a selected string selection line in a selected memory layer among the plurality of memory layers;

verifying whether threshold voltages of a plurality of string selection transistors coupled with the selected string selection line reach a target value to determine the plurality of string selection transistors as programmed string selection transistors or unprogrammed string selection transistors;

applying a voltage equal to or higher than a common collector voltage to first bitlines coupled with the unprogrammed string selection transistors, applying a ground voltage to second bitlines coupled with the programmed string selection transistors, and applying a second program voltage to the dummy ground line, thereby inducing channel potential boosting at memory strings respectively coupled with the unprogrammed string selection transistors, such that dummy ground transistor in memory strings respectively coupled with the programmed string selection transistors is programmed to have a predetermined threshold voltage and dummy ground transistor in the first memory strings are not programmed; and selectively programming the unprogrammed string selection transistors by turning the programmed dummy ground transistors off and applying a third program voltage to the selected string selection line.

2. The method of claim 1, wherein applying the first program voltage, verifying whether the threshold voltages of the plurality of string selection transistors reach the target value, and selectively programming the unprogrammed string selection transistors respectively include performing an incremental step pulse programming (ISPP) technique.

3. The method of claim 1, wherein the plurality of selection transistors coupled with the selected string selection line is a first plurality of string selection transistors, the method further comprising, before applying the first program voltage is performed, erasing a second plurality of string selection transistors coupled with the plurality of string selection lines and a plurality of dummy ground transistors coupled with the dummy ground line, the second plurality of string selection transistors including the first plurality of string selection transistors.

4. The method of claim 1, wherein verifying whether the threshold voltages of the plurality of string selection transistors reach the target value includes:

applying a sensing voltage is applied to the plurality of bitlines; and applying a voltage substantially equal to the sensing voltage is to common source lines of the unselected memory layers among the plurality of memory layers.

5. The method of claim 1, wherein selectively programming the unprogrammed string selection transistors includes applying a ground voltage to a common source line of the selected memory layer, applying a common collector voltage to common source lines of the unselected memory layers among the plurality of memory layers and to the plurality of bitlines to float channel lines of memory strings of the unselected memory layers.

6. The method of claim 1, wherein the 3D non-volatile memory device has a channel stacked structure, a straight-shaped bit cost scalable (BiCs) structure, a pipe-shaped BiCs structure, or a combination thereof.

7. The method of claim 1, wherein the 3D non-volatile memory device is a NAND flash memory device.

* * * * *